(12) United States Patent
Kadoshima et al.

(10) Patent No.: US 11,081,596 B2
(45) Date of Patent: Aug. 3, 2021

(54) SEMICONDUCTOR DEVICE AND MANUFACTURING DEVICE OF THE SAME

(71) Applicant: Renesas Electronics Corporation, Tokyo (JP)

(72) Inventors: Masaru Kadoshima, Tokyo (JP); Masao Inoue, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/904,601

(22) Filed: Feb. 26, 2018

(65) Prior Publication Data
US 2018/0308991 A1 Oct. 25, 2018

(30) Foreign Application Priority Data
Apr. 19, 2017 (JP) .............................. JP2017-082900

(51) Int. Cl.
*H01L 29/792* (2006.01)
*H01L 29/423* (2006.01)
*H01L 21/28* (2006.01)
*H01L 29/66* (2006.01)
*H01L 27/11568* (2017.01)
(Continued)

(52) U.S. Cl.
CPC ........ *H01L 29/7923* (2013.01); *H01L 21/022* (2013.01); *H01L 21/0217* (2013.01); *H01L 21/0228* (2013.01); *H01L 21/02164* (2013.01); *H01L 21/02211* (2013.01); *H01L 21/02238* (2013.01); *H01L 21/02255* (2013.01); *H01L 21/02271* (2013.01); *H01L 21/02323* (2013.01); *H01L 21/02326* (2013.01); *H01L 21/02343* (2013.01); *H01L 27/11568* (2013.01); *H01L 29/40117* (2019.08); *H01L 29/4234* (2013.01);
(Continued)

(58) Field of Classification Search
CPC ................. H01L 29/792; H01L 29/513; H01L 21/02271–0228
See application file for complete search history.

(56) References Cited

U.S. PATENT DOCUMENTS 4,365,264 A * 12/1982 Mukai ................... H01L 21/312
257/759
5,926,722 A * 7/1999 Jang ................... H01L 21/31053
257/E21.244
(Continued)

FOREIGN PATENT DOCUMENTS

JP 2016-072470 A 5/2016

OTHER PUBLICATIONS

Japanese Notice of Reasons for Refusal issued in corresponding Japanese Patent Application No. 2017-082900, dated Aug. 18, 2020, with English translation.

*Primary Examiner* — John A Bodnar
(74) *Attorney, Agent, or Firm* — McDermott Will & Emery LLP

(57) ABSTRACT

To improve the performance of a semiconductor device, the semiconductor device includes an insulating film portion over a semiconductor substrate. The insulating film portion includes an insulating film containing silicon and oxygen, a first charge storage film containing silicon and nitrogen, an insulating film containing silicon and oxygen, a second charge storage film containing silicon and nitrogen, and an insulating film containing silicon and oxygen. The first charge storage film is included by two charge storage films.

13 Claims, 25 Drawing Sheets

(51) Int. Cl.
 *H01L 21/02* (2006.01)
 *H01L 29/51* (2006.01)
(52) U.S. Cl.
 CPC ...... *H01L 29/66833* (2013.01); *H01L 29/513* (2013.01)

(56) References Cited

U.S. PATENT DOCUMENTS

| | | | | |
|---|---|---|---|---|
| 5,981,404 | A | * | 11/1999 | Sheng ............... H01L 21/28202 |
| | | | | 438/791 |
| 9,508,554 | B2 | | 11/2016 | Yamabe et al. |
| 2002/0024119 | A1 | * | 2/2002 | Tanaka ............. H01L 21/76802 |
| | | | | 257/649 |
| 2002/0028541 | A1 | * | 3/2002 | Lee ................... H01L 27/11556 |
| | | | | 438/149 |
| 2004/0238878 | A1 | * | 12/2004 | Sato ...................... H01L 29/792 |
| | | | | 257/315 |
| 2007/0066083 | A1 | * | 3/2007 | Yang ..................... C23C 16/308 |
| | | | | 438/764 |
| 2008/0290400 | A1 | * | 11/2008 | Jenne ................. H01L 29/4916 |
| | | | | 257/324 |
| 2009/0061650 | A1 | * | 3/2009 | Lee ..................... H01L 29/7923 |
| | | | | 438/787 |
| 2009/0175089 | A1 | | 7/2009 | Eitan et al. |
| 2009/0237990 | A1 | * | 9/2009 | Murai ............... H01L 27/11565 |
| | | | | 365/185.01 |
| 2010/0327281 | A1 | * | 12/2010 | Nakajima ......... H01L 29/78678 |
| | | | | 257/57 |
| 2015/0187960 | A1 | * | 7/2015 | Ramkumar ......... H01L 29/7926 |
| | | | | 257/66 |
| 2015/0371998 | A1 | * | 12/2015 | Lue ................... H01L 29/66833 |
| | | | | 257/326 |

\* cited by examiner

SEMICONDUCTOR DEVICE AND MANUFACTURING DEVICE OF THE SAME

CROSS-REFERENCE TO RELATED APPLICATIONS

The disclosure of Japanese Patent Application No. 2017-082900 filed on Apr. 19, 2017 including the specification, drawings and abstract is incorporated herein by reference in its entirety.

BACKGROUND

The present invention relates to a semiconductor device and a manufacturing method of the same, and particularly relates to an effective technique when being applied to a semiconductor device including non-volatile memories in a mixed manner and a manufacturing method of the same.

Japanese Unexamined Patent Application Publication No. 2016-72470 discloses a manufacturing method of a semiconductor device including non-volatile memories in a mixed manner. In the manufacturing method, an insulating film, included by a thin oxide film, is formed by using processing liquid containing water in a midway position in a charge storage portion in its thickness direction.

SUMMARY

The inventors of the present application are studying forming an insulating film, included by a thin oxide film, in a midway position in a charge storage portion in its thickness direction in a semiconductor device including non-volatile memories in a mixed manner and a manufacturing method of the semiconductor device.

It is desired to improve the performance of the semiconductor device in the semiconductor device and the manufacturing method described above.

Other objects and novel features will be apparent from the description of this specification and the accompanying drawings.

A semiconductor device according to an embodiment includes an insulating film portion formed over a semiconductor substrate. The insulating film portion includes a first insulating film containing silicon and oxygen, a second insulating film that is formed over the first insulating film and contains silicon and nitrogen, a third insulating film that is formed over the second insulating film and contains silicon and oxygen, a fourth insulating film that is formed over the third insulating film and contains silicon and nitrogen, and a fifth insulating film that is formed over the fourth insulating film and contains silicon and oxygen. The second insulating film includes an underlying insulating film and an upper insulating film.

According to the embodiment, it is possible to improve the performance of a semiconductor device.

DETAILED DESCRIPTION

The following embodiments will be described while being divided into a plurality of sections or embodiments, if necessary for the sake of convenience. However, unless otherwise specified, these are not independent of each other, but are in a relation such that one is a modification, details, complementary explanation, or the like of a part or the whole of the other.

In the following embodiments, when a reference is made to the number of elements and the like (including number, numerical value, quantity, range, or the like), the number of elements is not limited to the specific number, but may be the specific number or more or less, unless otherwise specified, or except the case where the number is apparently limited to the specific number in principle, or except for other cases.

Further, in the following embodiments, the constitutional elements (including element steps or the like) are not always essential, unless otherwise specified, or except the case where they are apparently considered essential in principle, or except for other cases.

Similarly, in the following embodiments, when a reference is made to the shapes, positional relationships, or the like of the constitutional elements or the like, it is understood that they include ones substantially analogous or similar to the shapes or the like, unless otherwise specified, or unless otherwise considered apparently in principle, or except for other cases. These are also the same for the foregoing numerical value or range.

Throughout the drawings for explaining the embodiments, the same components are labeled with the same reference sign in principle and repetition of the description is omitted. To clarify the drawings, hatching may be added even in a plan view.

Embodiment

The present embodiment is described by referring to a semiconductor device that includes a MONOS (Metal Oxide Nitride Oxide Silicon) rewritable non-volatile memory, as an example.

The non-volatile memory is one of non-volatile memories that can be electrically rewritable both in a write operation and an erase operation, and is also referred to as an electrically erasable programmable read-only memory. The non-volatile memory according to the present embodiment is included by a MONOS transistor.

Fowler-Nordheim (FN) tunneling is used for a write operation and an erase operation of the MONOS transistor, for example. It is also possible to achieve the write operation and the erase operation by using hot electrons or hot holes.

<Configuration of Semiconductor Device>

Figure 1:
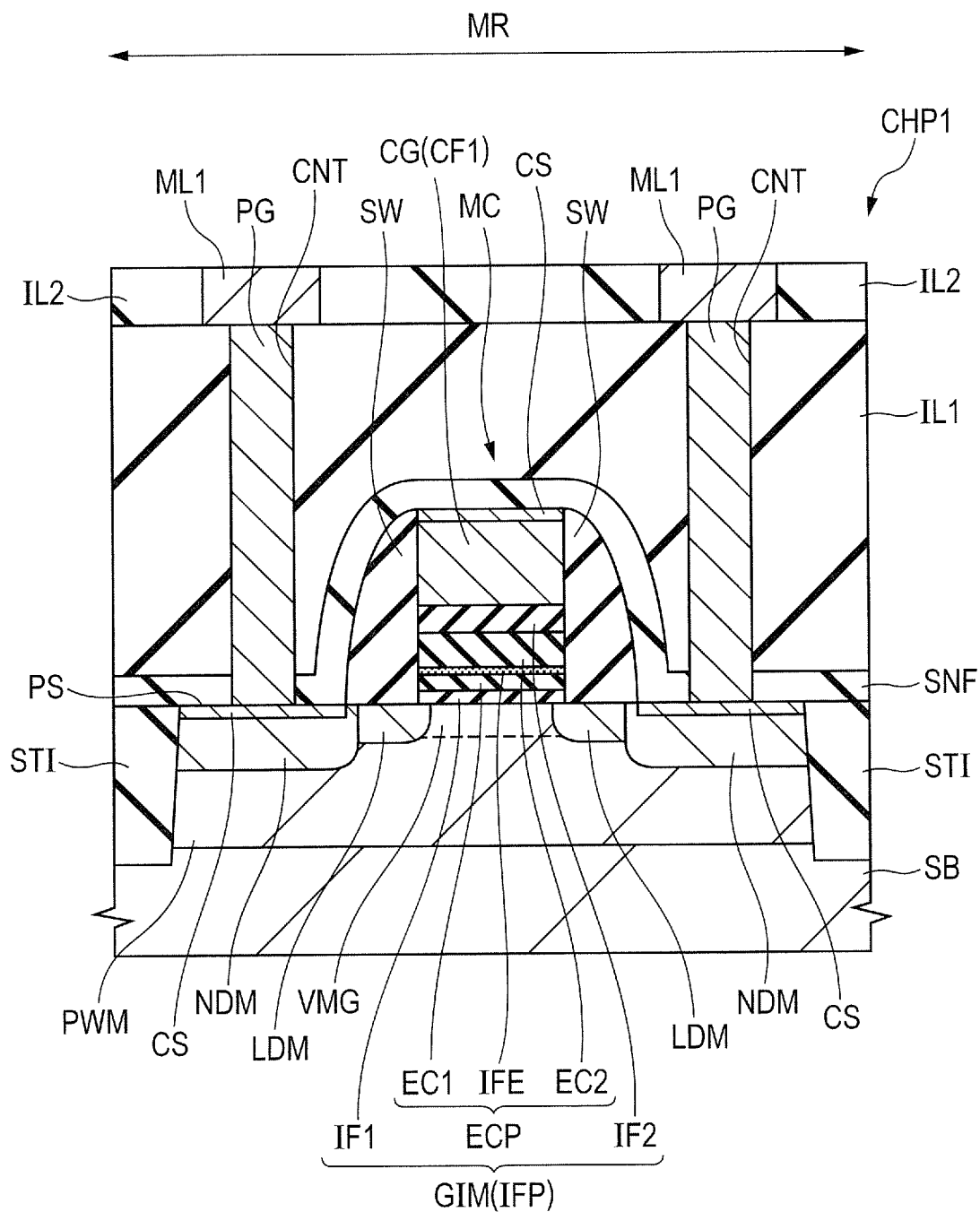
FIG. 1 is a cross-sectional view of a main portion of a semiconductor device according to the present embodiment.
Figure 2:
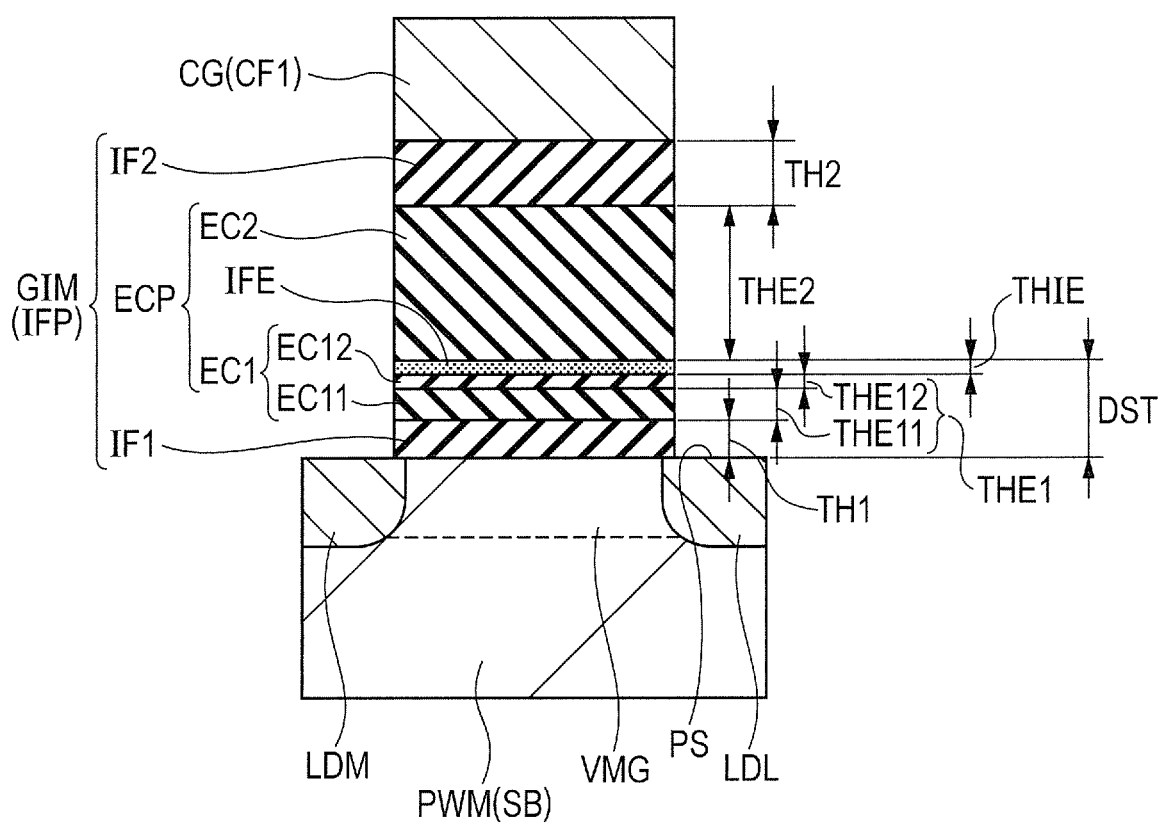
FIG. 2 is a cross-sectional view of a main portion of the semiconductor device according to the present embodiment.

The configuration of a semiconductor device CHP1 of an embodiment is described below with reference to the drawings. FIGS. 1 and 2 are cross-sectional views of a main portion of the semiconductor device according to the embodiment. FIG. 2 is an enlarged cross-sectional view that enlarges and illustrates a gate insulating film GIM and its surroundings in the cross-sectional view of the main portion of the semiconductor device of the embodiment. In order to simplify the understanding, illustration of a portion above a MONOS transistor MC, such as an interlayer insulating film IL1, and a silicide film CS is omitted in FIG. 2.

As illustrated in FIG. 1, the semiconductor device CHP1 of the embodiment includes a memory forming region MR. Non-volatile memory cells are formed in an array in the memory forming region MR, although not illustrated.

The semiconductor device CHP1 also includes a main-circuit forming region, although not illustrated. In the main-circuit forming region, a low breakdown voltage MISFET (Metal Insulator Semiconductor Field Effect Transistor) is formed, which requires a large current driving force in order to enable a high-speed operation.

It can be considered that a region where such a low breakdown voltage MISFET is formed is a region where a CPU Central Processing Unit) is formed, a region where a ROM (Read-Only Memory) is formed, or a region where a RAM (Random Access Memory) is formed, for example. The low breakdown voltage MISFET operates with a power-supply voltage of about 1.5 V, for example.

Further, a high breakdown voltage MISFET is formed in the main-circuit forming region, although not illustrated. For example, the region where such a high breakdown voltage MISFET is formed can be a region where an analog circuit is formed or a region where an I/O circuit. The high breakdown voltage MISFET operates with a power-supply voltage of about 5 V, for example.

As illustrated in FIG. 1, memory cells of non-volatile memories illustrated in FIG. 1 are formed in the memory forming region MR. Each memory cell is included by a MONOS transistor MC.

As illustrated in FIG. 1, the semiconductor device CHP1 includes a semiconductor substrate SB. An element isolation region STI for isolating an element is formed in a top surface PS as a principal surface of the semiconductor substrate SB. An active region isolated by the element isolation region STI serves as the memory forming region MR.

That is, the memory forming region MR is a portion of the top surface PS of the semiconductor substrate SB. In the memory forming region MR, a p-well PWM is formed on the top surface PS side in the semiconductor substrate SB. Further, a p-type semiconductor region VMG is formed in an upper layer portion of the p-well PWM, that is, a portion including a channel region.

Note that the "p-type" means a conductivity type for which a main charge carrier is a hole.

Next, the MONOS transistor MC illustrated in FIG. 1 is described. The MONOS transistor MC includes the p-well PWM, the p-type semiconductor region VMG, a gate insulating film GIM, a gate electrode CG, a sidewall spacer SW, an $n^-$-type semiconductor region LDM, and an $n^+$-type semiconductor region NDM.

That is, the non-volatile memory is included by the gate electrode CG and the gate insulating film GIM. In the non-volatile memory, a voltage is applied across the semiconductor substrate SB and the gate electrode CG, and electrons are injected from the p-well PWM of the semiconductor substrate SB, that is, the p-type semiconductor region VMG to the gate insulating film GIM. In this manner, data is written.

Also, in the non-volatile memory, a voltage is applied across the semiconductor substrate SB and the gate electrode CG, and holes are injected from the p-well PWM of the semiconductor substrate SB, that is, the p-type semiconductor region VMG to the gate insulating film GIM. In this manner, data is erased.

Note that "$n^-$-type" and "$n^+$-type" mean a conductivity type opposite to the p-type, for which a main charge carrier is an electron.

As illustrated in FIG. 1, the p-well PWM is formed on a side close to the top surface PS in the semiconductor substrate SB. On the p-well PWM, the gate insulating film GIM is formed, which is included by an insulating film portion IFP. That is, the gate insulating film GIM is formed on the top surface PS of the semiconductor substrate SB. Further, the gate electrode CG, included by a conductive film CF1, is formed on the gate insulating film GIM. The gate electrode CG, that is, the conductive film CF1 is preferably formed by a polysilicon film.

On both side surfaces of the gate electrode CG, the sidewall spacers SW, included by an insulating film, for example, are formed as sidewall portions in order to form an LDD (Lightly Doped Drain) structure. In the upper layer portion of the p-well PWM located below the sidewall spacer SW, the $n^-$-type semiconductor region LDM is formed. The $n^+$-type semiconductor region NDM is formed in the upper layer portion of the p-well PWM located outside the $n^-$-type semiconductor region LDM in a plan view.

The $n^+$-type semiconductor region NDM is in contact with the $n^-$-type semiconductor region LDM. The impurity concentration of the $n^+$-type semiconductor region NDM is higher than that of the $n^-$-type semiconductor region LDM. Further, the channel region is formed in the upper layer portion of the p-well PWM located directly below the gate insulating film GIM. A silicide film CS is formed on the top surface of the gate electrode CG and the top surface of the $n^+$-type semiconductor region NDM in order to reduce a resistance.

The sidewall spacer SW is formed for making a source region and a drain region, which are semiconductor regions of the MONOS transistor MC, include an LDD structure. That is, each of the source region and the drain region of the MONOS transistor MC are formed by the $n^-$-type semiconductor region LDM and $n^+$-type semiconductor region NDM.

In formation of them, the source region below the gate electrode CG and the drain region below an end of the gate electrode CG are formed as the $n^-$-type semiconductor region LDM. This can suppress concentration of an electric field below the end of the gate electrode CG.

The gate insulating film GIM is included by the insulating film portion IFP, as illustrated in FIG. 2. The insulating film portion IFP is included by an insulating film IF1 formed on the top surface PS of the semiconductor substrate SB, a charge storage portion ECP formed on the insulating film IF1, and an insulating film IF2 formed on the charge storage portion ECP.

Further, the charge storage portion ECP is included by a charge storage film EC1, an insulating film IFE formed on the charge storage film EC1, and a charge storage film EC2 formed on the insulating film IFE.

The insulating film IF1 is an insulating film as a bottom oxide film, while the insulating film IF2 is an insulating film as a top oxide film. The charge storage film EC1 is a first charge storage portion that stores charges therein. The charge storage film EC2 is a second charge storage portion that stores charges therein.

As illustrated in FIGS. 1 and 2, the charge storage film EC1 has a two layer structure including a charge storage film EC11 as an underlying insulating film and a charge storage film EC12 as an upper insulating film.

The insulating film IF1 is an insulating film containing silicon and oxygen, and is preferably formed of silicon oxide. The charge storage film EC1 is an insulating film containing silicon and nitrogen, and is preferably formed of silicon nitride. The insulating film IFE is an insulating film containing silicon and oxygen, and is preferably formed of silicon oxide or silicon oxynitride. The charge storage film EC2 is an insulating film containing silicon and nitrogen, and is preferably formed of silicon nitride. The insulating film IF2 is an insulating film containing silicon and oxygen, and is preferably formed of silicon oxide.

The charge storage film EC12 is a silicon nitride film with a lower film density (atom density) than the charge storage film EC11, or a silicon nitride film with a higher oxygen concentration than the charge storage film EC11. A silicon nitride film with a low film density allows oxygen to be taken thereinto easily, and eventually becomes a silicon nitride film with a high oxygen concentration.

Figure 30:
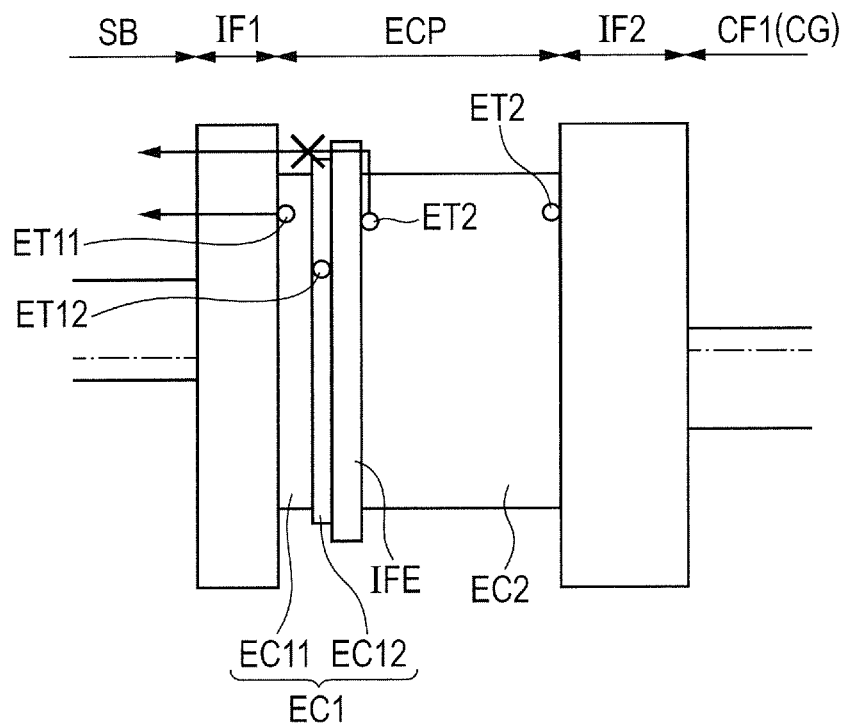
FIG. 30 is a band diagram illustrating an energy distribution in a write state of the semiconductor device according to the present embodiment.

From the above, the band gap of each of the insulating film IF1, the insulating film IFE, and the insulating film IF2 is larger than the band gap of any of the charge storage film EC11, the charge storage film EC12, and the charge storage film EC2, as illustrated in FIG. 30 referred to later. Further, an electron trap position, such as an impurity level, is present in the band gap of any of the charge storage film EC11, the charge storage film EC12, and the charge storage film EC2. Consequently, it is possible to store charges in the charge storage film EC11, the charge storage film EC12, and the charge storage film EC2.

It is preferable that the thickness THE12 of the charge storage film EC12 according to the present embodiment is as small as possible, as compared with the thickness THE11 of the charge storage film EC11. When the film density of a silicon nitride film is high, the number of shallow electron trap positions in terms of energy, originating from impurities or voids (spaces), is small, although details will be described later. Therefore, a probability of tunneling in which carriers pass through the insulating film IF1 and leak to the semiconductor substrate SB is small, and excellent data retention characteristics are obtained. Accordingly, the data retention characteristics can be improved by increasing a ratio of the charge storage film EC11 with a higher film density in the charge storage portion ECP than the charge storage film EC12.

In addition, it is preferable that the thickness THE2 of the charge storage film EC2 is larger than the thickness THE1 of the charge storage film EC1. With this setting, the insulating film IFE can be arranged to be closer to the semiconductor substrate SB than a central portion of the charge storage portion ECP in the thickness direction.

A main purpose for providing the insulating film IFE is to improve the data retention characteristics. Meanwhile, a charge injection efficiency has a trade-off relationship with the data retention characteristics. In the memory cell in the present embodiment, the thickness THE1 of the charge storage film EC1 is made relatively smaller than the thickness THE2 of the charge storage film EC2 in the charge storage portion ECP. Thus, even in a case where the insulating film IFE is provided, it is possible to improve an efficiency of electron injection from the substrate side to the charge storage film EC2.

Further, it is preferable that the thickness THIE of the insulating film IFE is smaller than the thickness THE1 of the charge storage film EC1 so that the thickness THIE of the insulating film IFE is relatively smaller in the charge storage portion ECP. With this setting, it is possible to cause electrons or holes to tunnel through the insulating film IF1, the charge storage film EC1, and the insulating film IFE, so that the electrons or the holes are easily injected into the charge storage film EC2 from the semiconductor substrate SB.

The thickness THIE of the insulating film IEF is smaller than the thickness TH1 of the insulating film IF1. Therefore, the thickness of the insulating film IF1 as a bottom oxide film can be ensured. In addition, the thickness TH1 of the insulating film IF1 as the bottom oxide film is preferably about 2 nm in order to enable a direct tunneling erase operation of holes from the semiconductor substrate SB to the charge storage film EC1.

From the above viewpoints, it is preferable that the thickness THIE of the insulating film IFE is 0.1 to 0.5 nm, the thickness THE1 of the charge storage film EC1 is 1.5 to 2.0 nm, and the thickness THE2 of the charge storage film EC2 is about 6 nm. Further, it is preferable that the thickness THE11 of the charge storage film EC11 including the charge storage film EC1 is 1.0 to 2.0 nm, and the thickness THE12 of the charge storage film EC12 is 0.1 to 0.5 nm.

In order to form the insulating film IFE sufficiently, it is more preferable that the thickness THE11 of the charge storage film EC11 is 1.0 nm, the thickness THE12 of the charge storage film EC12 is 0.5 nm, and the thickness THIE of the insulating film IFE is 0.5 nm, although the details will be described later.

Furthermore, an insulating film SNF is formed on the semiconductor substrate SB to cover the MONOS transistor MC, as illustrated in FIG. 1. The insulating film SNF is preferably formed of silicon nitride.

An interlayer insulating film IL1 is formed on the insulating film SNF. The interlayer insulating film IL1 is preferably formed by an insulating film of silicon oxide, or a multilayered film of an insulating film of silicon nitride and an insulating film of silicon oxide, for example. The top surface of the interlayer insulating film IL1 is flattened.

A contact hole CNT is formed in the interlayer insulating film IL1. A plug PG formed by a conductor film is embedded in the contact hole CNT. The plug PG is included by a thin barrier conductor film formed on the bottom and the sidewall, that is, the side surface of the contact hole CNT and a main conductor film formed on this barrier conductor film to be embedded in the contact hole CNT.

FIG. 1 illustrates the barrier conductor film and the main conductor film that include the plug PG in an integrated manner for simplifying the drawing. The barrier conductor film including the plug PG can be preferably a titanium (Ti) film, a titanium nitride (TiN) film, or a multilayered film of those films, while the main conductor film including the plug PG can be preferably a tungsten (W) film.

The plug PG is formed on the $n^+$-type semiconductor region NDM, and is also formed on the gate electrode CG although not illustrated. The plug PG is electrically coupled to the $n^+$-type semiconductor region NDM, and is also electrically coupled to the gate electrode CG although not illustrated.

An interlayer insulating film IL2 is formed on the interlayer insulating film IL1 in which the plug PG is embedded. In a wiring groove formed in the interlayer insulating film IL2, first-layer wiring ML1 is formed as damascene wiring that is embedded wiring containing copper (Cu) as a main conductive material, preferably.

Upper-layer wiring is also formed as damascene wiring on the first-layer wiring. However, illustration and description thereof is omitted here. The first-layer wiring and the upper-layer wiring are not limited to damascene wiring, but can be also formed by patterning a conductive film for wiring. The first-layer wiring and the upper-layer wiring can be preferably tungsten (W) wiring or aluminum (Al) wiring, for example.

<Operation of Non-Volatile Memory>

The semiconductor device in the present embodiment has the configuration described above. Next, an operation of a memory cell (non-volatile memory cell) included in this semiconductor device is described.

Figure 3:
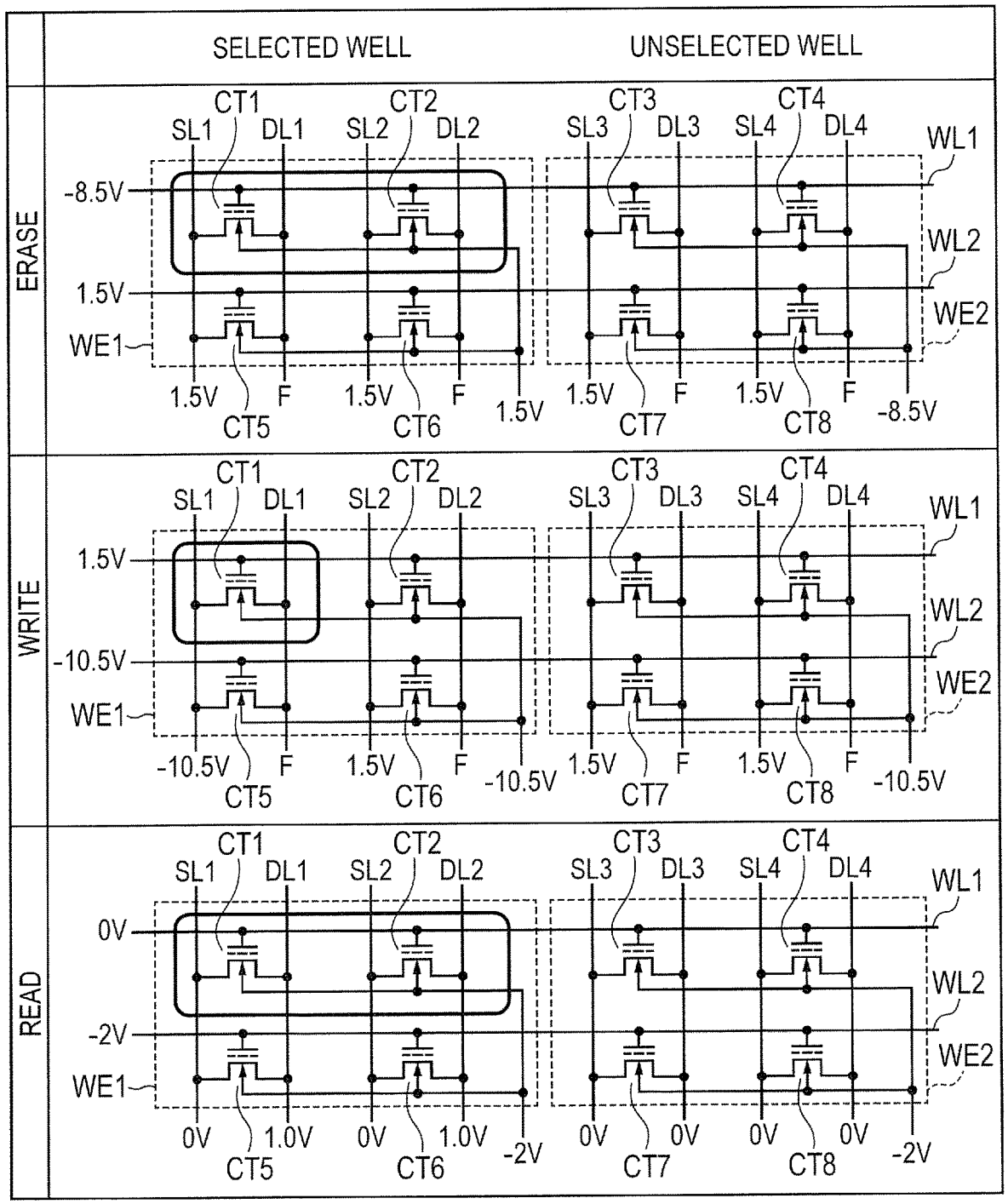
FIG. 3 illustrates an example of a memory array structure of a non-volatile memory and an operating condition.

FIG. 3 illustrates an example of a memory array structure of a non-volatile memory and an operating condition (one cell/one transistor). In FIG. 3, each of cell transistors CT1 to CT8 corresponds to a memory cell included by the MONOS transistor MC illustrated in FIG. 1. A gate electrode of each of the cell transistors CT1 to CT4 is coupled to a word line WL1. A gate electrode of each of the cell transistors CT5 to CT8 is coupled to a word line WL2.

A source region of each of the cell transistors CT1 and CT5 is coupled to a source line SL1. A source region of each of the cell transistors CT2 and CT6 is coupled to a source line SL2. A source region of each of the cell transistors CT3 and CT7 is coupled to a source line SL3. A source region of each of the cell transistors CT4 and CT8 is coupled to a source line SL4.

A drain region of each of the cell transistors CT1 and CT5 is coupled to a data line DLL A drain region of each of the cell transistors CT2 and CT6 is coupled to a data line DL2. A drain region of each of the cell transistors CT3 and CT7 is coupled to a data line DL3. A drain region of each of the cell transistors CT4 and CT8 is coupled to a data line DL4.

A back gate of each of the cell transistors CT1, CT2, CT5, and CT6 is coupled to a well WE1. A back gate of each of the cell transistors CT3, CT4, CT7, and CT8 is coupled to a well WE2.

FIG. 3 illustrates a case where memory cells are arranged in a 2×4 matrix for simplifying the description. However, the memory cell arrangement is not limited thereto. Actually more memory cells are arranged in a matrix to form a memory cell array. Further, the memory cell arrangement on the same well and the same word line is a two column configuration of the cell transistors CT1 and CT2, for example, in FIG. 3. In an 8-bit (1 byte) configuration, eight cell transistors are formed on the same well. In this case, erasing and writing for memory cells are performed in bytes.

Next, erase, write, and read operations for a memory cell that is a 1-cell 1-transistor type are described with reference to FIG. 3.

First, the erase operation is described. For example, a case of erasing data stored in the cell transistors CT1 and CT2 as memory cells (selected memory cells) from which data is erased is considered. A potential of the selected well WE1 is set to 1.5 V, a potential of the word line WL1 is set to −8.5 V, potentials of the source lines SL1 and SL2 are set to 1.5 V, and the data lines DL1 and DL2 are made floated (represented with F in FIG. 3). As a result, charges stored in charge storage films of the cell transistors CT1 and CT2 are drawn toward a semiconductor substrate, so that data is erased.

At this time, for the cell transistors CT3 to CT8 that are other memory cells (unselected memory cells) for which erasing is not performed, a potential of the unselected well WE2 is set to −8.5 V, a potential of the word line WL2 is set to 1.5 V, potentials of the source line SL3 and SL4 are set to 1.5 V, and potentials of the data lines DL3 and DL4 are made floated. This setting prevents charge stored in charge storage films in the cell transistors CT3 to CT8 from escaping, so that erasing is not performed.

Next, the write operation is described. For example, a case is considered in which data is written to the cell transistor CT1 as a memory cell (selected memory cell) for which data is to be written. The potential of the selected well WE1 is set to −10.5 V, the potential of the word line WL1 is set to 1.5 V, the potential of the source line SL1 is set to −10.5 V, and the data line DL1 is made floated. With this setting, charges are injected into the charge storage film of the cell transistor CT1, so that writing of data is performed.

At this time, for the other cell transistors CT2 to CT8 (unselected memory cells) for which writing is not performed, the potential of the unselected well WE2 is set to −10.5 V, the potential of the word line WL2 is set to −10.5 V, the potentials of the source lines SL2 to SL4 are set to 1.5 V, and the potentials of the data lines DL2 to DL4 are made floated. This setting prevents charge injection to the charge storage films of the cell transistors CT2 to CT8.

Next, the read operation is described. It is assumed that data "0" has been already written in the cell transistor CT1 and a threshold voltage of its transistor is high, and the cell transistor CT2 has data "1" and a threshold voltage of its transistor is low, for example. In a case of reading the data of the cell transistors CT1 and CT2, the potential of the selected well WE1 is set to −2 V, the potential of the word line WL1 is set to 0 V, the potentials of the source lines SL1 and SL2 are set to 0 V, and potentials of the data lines DL1 and DL2 are set to 1.0 V. With this setting, the data of the cell transistors CT1 and CT2 is read. In this case, because the threshold voltage of the cell transistor CT1 is high and the threshold voltage of the cell transistor CT2 is low, the potential of the data line DL1 is not changed but the potential of the data line DL2 is lowered.

Further, for the other cell transistors CT3 to CT8 for which reading is not performed, the potential of the unselected well WE2 is set to −2 V, the potential of the word line WL2 is set to −2 V, the potentials of the source line SL3 and SL4 are set to 0 V, and the potentials of the data lines DL3 and DL4 are set to 0 V, thereby preventing the cell transistors CT3 to CT8 from turning on. By lowering a back gate potential of the unselected memory cell during reading, a selecting transistor is not required for a memory cell.

<Manufacturing Method of Semiconductor Device>

Next, a manufacturing method of the semiconductor device of the present embodiment is described.

Figure 4:
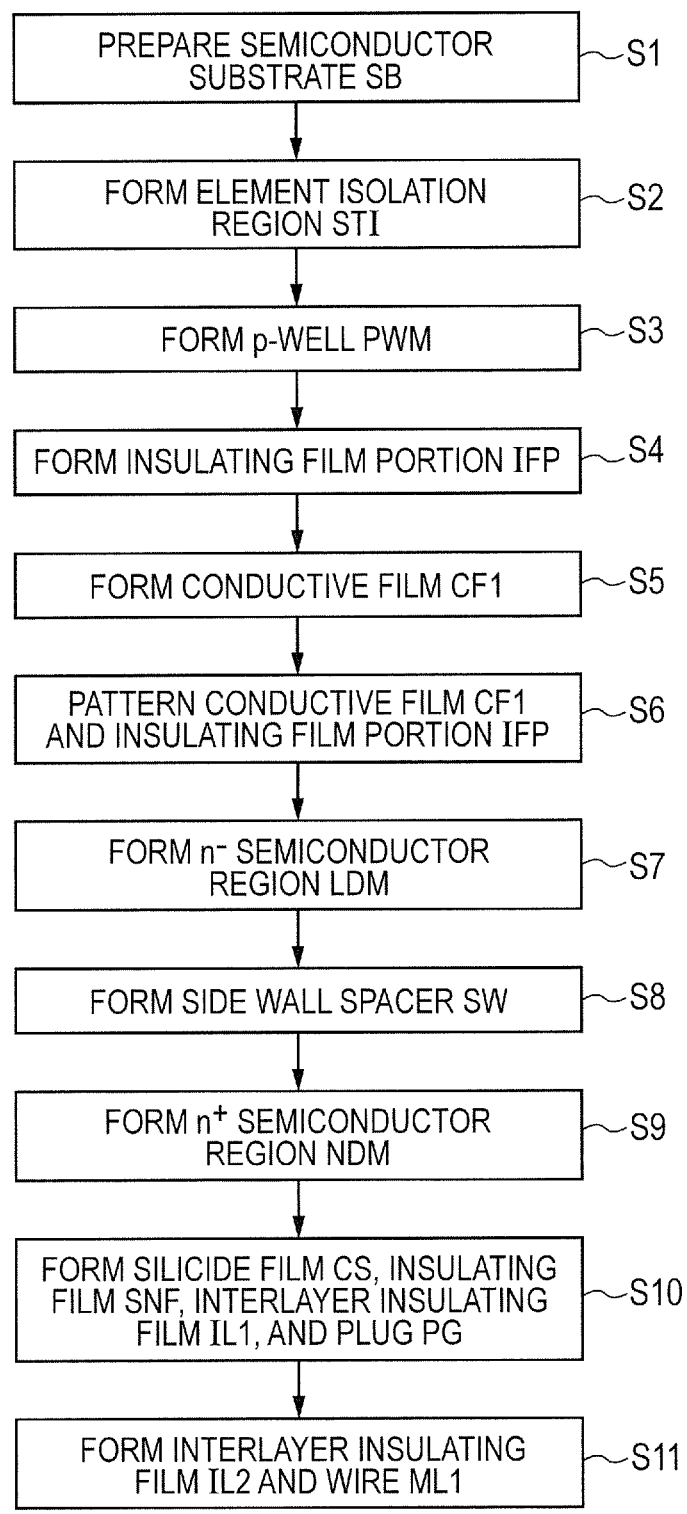
FIG. 4 is a flowchart illustrating a manufacturing process of the semiconductor device according to the present embodiment.
Figure 5:
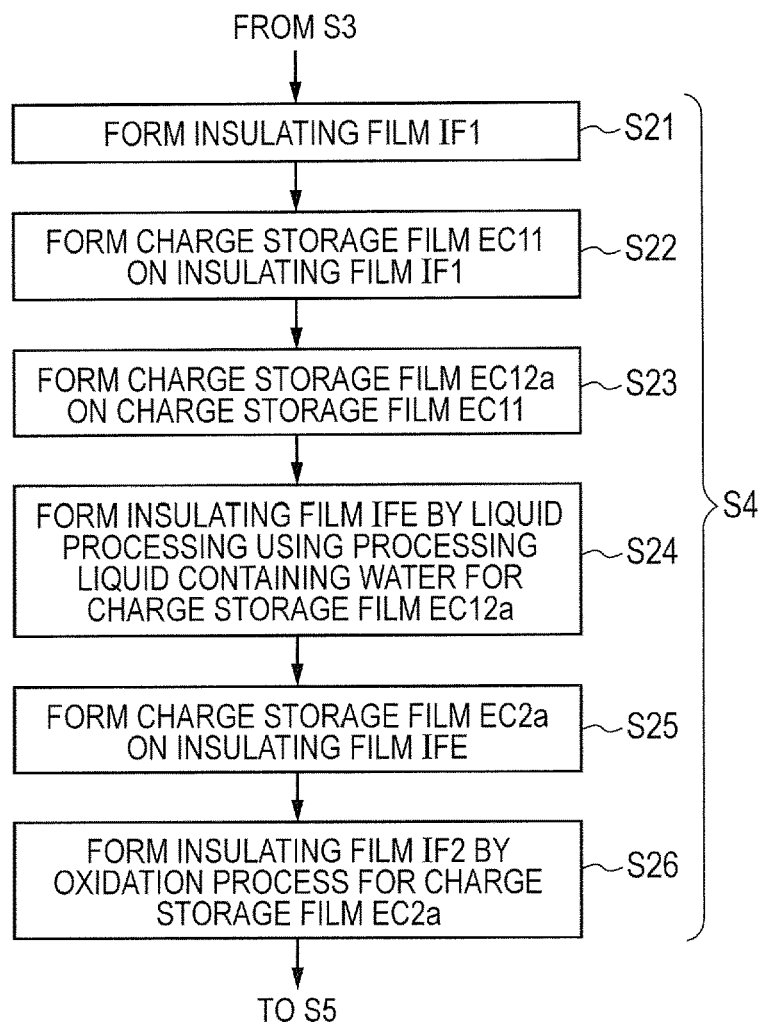
FIG. 5 is a flowchart illustrating a portion of the manufacturing process of the semiconductor device according to the present embodiment.

FIGS. 4 and 5 are flowcharts illustrating a portion of manufacturing process of the semiconductor device according to the present embodiment. FIGS. 6 to 21 are cross-sectional views of a main portion of the semiconductor device according to the present embodiment during the manufacturing process. FIG. 5 illustrates processes included in Step 4 in FIG. 4. FIGS. 7 to 10, 12 to 14, 16, and 18 are enlarged cross-sectional views that enlarge and illustrate a region where the gate insulating film GIM is formed and its surroundings in the cross-sectional view of the main portion of the semiconductor device of the embodiment. In order to simplify the understanding, illustration of a portion above the MONOS transistor MC, such as the interlayer insulating film IL1, and the silicide film CS is omitted in FIGS. 7 to 10, 12 to 14, 16, and 18.

In the present embodiment, a case is described in which an n-channel MONOS transistor MC is formed in the memory forming region MR. However, it is also possible to reverse the conductivity type and form a p-channel MONOS transistor MC.

Figure 6:
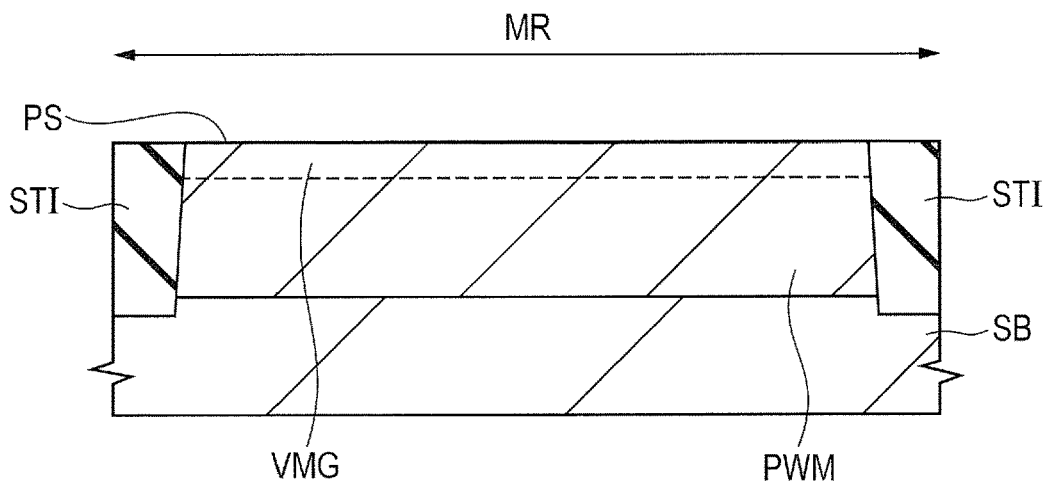
FIG. 6 is a cross-sectional view of a main portion of the semiconductor device according to the present embodiment during the manufacturing process.

First, the semiconductor substrate SB is prepared, as illustrated in FIG. 6 (Step S1 in FIG. 4). In this Step S1, the semiconductor substrate SB is prepared, which is formed of single crystal silicon with p-type impurities, such as boron (B), introduced thereinto and preferably has a resistivity of about 1 to 10 Ωcm. In this step, the semiconductor substrate SB is in the form of an approximately disk-shaped semiconductor wafer.

Subsequently, the element isolation region STI is formed, as illustrated in FIG. 6 (Step S2 in FIG. 4). In Step S2, the element isolation region STI is formed preferably by STI (Shallow Trench Isolation) or LOCOS (Local Oxidation of Silicon). A method of forming the element isolation region STI by STI is described below.

In this STI, first, an element isolation groove is formed in the semiconductor substrate SB by photolithography and etching. Thereafter, an insulating film, preferably formed by a silicon oxide film, is formed on the semiconductor substrate SB in such a manner that the element isolation groove is embedded with the insulating film. An unnecessary portion of the insulating film formed on the semiconductor substrate SB is then removed by CMP (Chemical Mechanical Polishing). In this manner, it is possible to form the element isolation region STI where the insulating film is embedded only in the element isolation groove.

Figure 7:
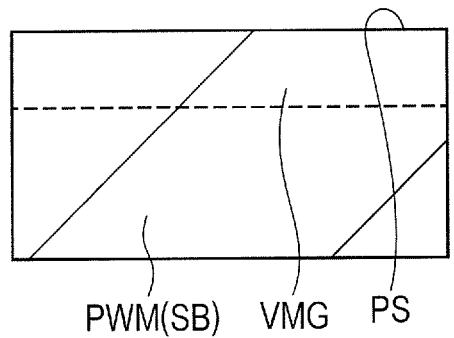
FIG. 7 is an enlarged cross-sectional view of the main portion of the semiconductor device during the manufacturing process illustrated in FIG. 6.

Subsequently, the p-well PWM is formed, as illustrated in FIGS. 6 and 7 (Step S3 in FIG. 4).

In this Step S3, p-type impurities, such as boron (B), are introduced into the semiconductor substrate SB preferably by ion implantation that uses a patterned resist film (not illustrated) as mask, as illustrated in FIGS. 6 and 7.

Subsequently, in this Step S3, n-type impurities, such as arsenic (As), or p-type impurities, such as boron (B), are ion-implanted into the semiconductor substrate SB, as illustrated in FIGS. 6 and 7, thereby forming the p-type semiconductor region VMG in an upper-layer portion of the p-well PWM, that is, a portion forming a channel region in the memory forming region MR.

An implanting energy of the p-type impurity ions in this ion implantation is preferably about 20 keV and a dose amount can be set to about $1.5 \times 10^{13}$ cm$^{-2}$, preferably. By adjusting the type of the impurities to be ion-implanted or a condition of ion implantation in this ion implantation, a threshold voltage of the MONOS transistor MC can be adjusted.

Note that "n-type" means a conductivity type opposite to the p-type, for which a main charge carrier is an electron.

Subsequently, the insulating film portion IFP is formed, as illustrated in FIGS. 8 to 14 (Step S4 in FIG. 4).

In particular, in the present embodiment, the process in Step S4 in FIG. 4 includes a process of forming the insulating film IF1 on the top surface PS of the semiconductor substrate SB (Step S21 in FIG. 5), a process of forming the charge storage film EC11 on the insulating film IF1 (Step S22 in FIG. 5), and a process of forming the charge storage film EC12a on the charge storage film EC11 (Step S23 in FIG. 5). Subsequent to those processes, the process in Step S4 in FIG. 4 includes a process of forming the insulating film IFE on the charge storage film EC12a (Step S24 in FIG. 5), a process of forming the charge storage film EC2a on the insulating film IFE (Step S25 in FIG. 5), and a process of forming the insulating film IF2 on the charge storage film EC2a (Step S26 in FIG. 5).

Figure 8:
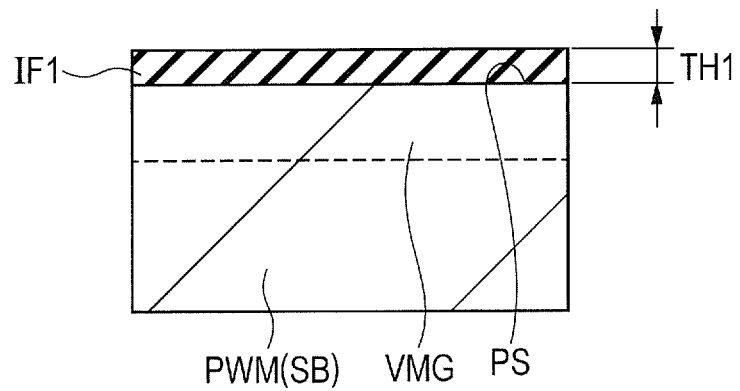
FIG. 8 is an enlarged cross-sectional view of the main portion of the semiconductor device during the manufacturing process, subsequent to FIG. 7.

First, the insulating film IF1 is formed as illustrated in FIG. 8 (Step S21 in FIG. 5). In this Step S21, the insulating film IF1 is formed on the top surface PS of the semiconductor substrate SB, that is, on the p-well PWM in the memory forming region MR.

The insulating film IF1 is an insulating film containing silicon and oxygen, and is preferably formed of silicon oxide. Preferably, the insulating film IF1 can be formed by ISSG (In Situ Steam Generation) oxidation.

ISSG oxidation is a method of forming an oxide film of silicon oxide on a surface of a semiconductor substrate of silicon by directly introducing hydrogen and oxygen into a decompressed heat treatment chamber and causing radical oxidation reaction on the surface of the semiconductor substrate heated to a temperature of 800° C. to 1100° C., for example.

An oxidizing power in ISSG oxidation is higher than an oxidizing power in thermal oxidation or the like, because ISSG oxidation uses radical oxidation reaction. Therefore, it is possible to form the insulating film IF1 of silicon oxide that is dense and excellent in film quality by using ISSG oxidation. As described before, the thickness TH1 of the insulating film IF1 is about 2 nm.

Figure 9:
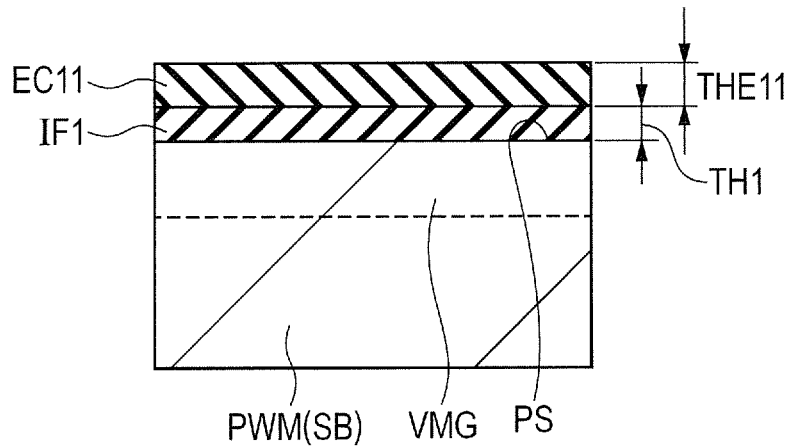
FIG. 9 is an enlarged cross-sectional view of the main portion of the semiconductor device during the manufacturing process, subsequent to FIG. 8.

Subsequently, the charge storage film EC11 is formed as illustrated in FIG. 9 (Step S22 in FIG. 5). In this Step S22, the charge storage film EC11 is formed on the insulating film IF1 in the memory forming region MR.

The charge storage film EC11 is an insulating film containing silicon and nitrogen, and is preferably formed of silicon nitride. The charge storage film EC11 is formed by ALD method (Atomic Layer Deposition) described below.

ALD method is a method of depositing atomic layers one layer by one layer by sequentially repeating a process of causing chemisorption of molecules of a first precursor gas to form one atomic layer, a process of removing surplus molecules of the first precursor gas, a process of causing molecules of a second precursor gas to react with the molecules of the first precursor gas to form a film by a reaction product, and a process of removing surplus molecules of the second precursor gas (an ALD cycle).

The outline of ALD method in Step S22 is described. First, the semiconductor substrate SB is heated to 500° C. to 600° C., and dichlorosilane ($SiH_2Cl_2$) gas, which is a first reaction gas, is supplied onto the semiconductor substrate SB and is caused to be sufficiently absorbed onto the insulating film IF1 on the semiconductor substrate SB. Thereafter, unabsorbed dichlorosilane ($SiH_2Cl_2$) gas is removed from the semiconductor substrate SB.

Subsequently, ammonia ($NH_3$) gas, which is a second reaction gas to react with dichlorosilane ($SiH_2Cl_2$) gas, is supplied onto the semiconductor substrate SB and is caused to react with dichlorosilane ($SiH_2Cl_2$) gas absorbed onto the insulating film IF1 on the semiconductor substrate SB, thereby forming a silicon nitride film on the insulating film IF1. Thereafter, unreacted ammonia ($NH_3$) gas is removed from the semiconductor substrate SB.

It is possible to form the uniform charge storage film EC11 of silicon nitride with a high density on the insulating film IF1 with good controllability by repeating supply and removal of the first reaction gas and supply and removal of the second reaction gas described above a predetermined number of times. As described before, the thickness THE11 of the charge storage film EC11 is about 1.0 to 2.0 nm.

Further, the charge storage film EC11 can be also formed by CVD (Chemical Vapor Deposition), and can be formed by LPCVD (Low Pressure Chemical Vapor Deposition) method that uses dichlorosilane ($SiH_2Cl_2$) gas and ammonia ($NH_3$) gas as material gases, for example. Alternatively, the charge storage film EC11 can be formed by LPCVD method that uses silane ($SiH_4$) gas and ammonia gas as material gases, for example.

However, in formation of a thin film, reaction of forming silicon nitride occurs more efficiently in ALD method than in LPCVD method and it is more difficult for chlorine or the like to remain in the formed film, for example, when ALD method and LPCVD method are compared with each other at the same temperature. Therefore, a uniform silicon nitride film with a high film density can be formed. Consequently, it is possible to form a more uniform thin film by ALD method than by LPCVD method. Accordingly, it is preferable that the charge storage film EC11 is formed by ALD method.

Figure 10:
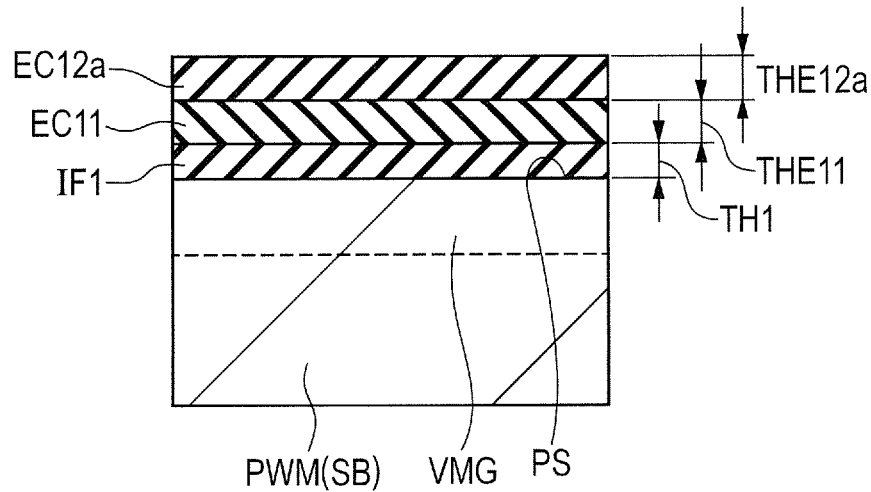
FIG. 10 is an enlarged cross-sectional view of the main portion of the semiconductor device during the manufacturing process, subsequent to FIG. 9.

Subsequently, a charge storage film EC12a is formed, as illustrated in FIG. 10 (Step S23 in FIG. 5).

Here, the charge storage film EC12a is the charge storage film EC12 before oxidation. The insulating film IFE according to the present embodiment is formed by oxidizing a portion (surface layer portion) of a charge storage film in the next Step S24. Therefore, the charge storage film before oxidation, which includes the portion to be oxidized to form the insulating film IFE and a portion to remain as the charge storage film EC12 below the insulating film IFE without being oxidized, is referred to as the charge storage film EC12a.

In this Step S23, the charge storage film EC12a is formed on the charge storage film EC11 in the memory forming region MR.

The charge storage film EC12a is an insulating film containing silicon and nitrogen, and is preferably formed of silicon nitride. The charge storage film EC12 is formed by ALD method in accordance with the following procedure.

First, the semiconductor substrate SB is heated to 400° C. to 500° C. lower than the temperature in Step S22, and dichlorosilane ($SiH_2Cl_2$) gas that is the first reaction gas is supplied onto the semiconductor substrate SB and is caused to be sufficiently absorbed onto the charge storage film EC11 on the semiconductor substrate SB. Thereafter, unabsorbed dichlorosilane ($SiH_2Cl_2$) gas is removed from the semiconductor substrate SB.

Subsequently, ammonia ($NH_3$) gas, which is the second reaction gas to react with dichlorosilane ($SiH_2Cl_2$) gas, is supplied onto the semiconductor substrate SB and is caused to react with dichlorosilane ($SiH_2Cl_2$) gas absorbed onto the charge storage film EC11 on the semiconductor substrate SB, thereby forming a silicon nitride film on the charge storage film EC11. Thereafter, unreacted ammonia ($NH_3$) gas is removed from the semiconductor substrate SB.

By repeating supply and removal of the first reaction gas and supply and removal of the second reaction gas described above a predetermined number of times. It is possible to form the uniform charge storage film EC12a of silicon nitride with a high density on the charge storage film EC11 with good controllability. The thickness THE12a of the charge storage film EC12a is about 0.2 to 1.0 nm.

Further, the charge storage film EC12a can be also formed by CVD, and can be formed by LPCVD method that uses dichlorosilane ($SiH_2Cl_2$) gas and ammonia ($NH_3$) gas as material gases, as with the charge storage film EC11, for example. Alternatively, the charge storage film EC12a can be formed by LPCVD method that uses silane ($SiH_4$) gas and ammonia gas as material gases, for example.

However, it is preferable to form the charge storage film EC12a by ALD method because ALD method can form a more uniform thin film than LPCVD method, as described before.

As described above, the film forming temperature of the charge storage film EC12a formed in Step S23 is lower than the film forming temperature of the charge storage film EC11 formed in Step S22. Therefore, the charge storage film EC12a is formed as an insulating film with a lower film density (atom density) than the charge storage film EC11. In addition, as described before, a silicon nitride film with a low film density allows oxygen to be easily taken thereinto, and eventually becomes a silicon nitride film with a high oxygen concentration.

Figure 11:
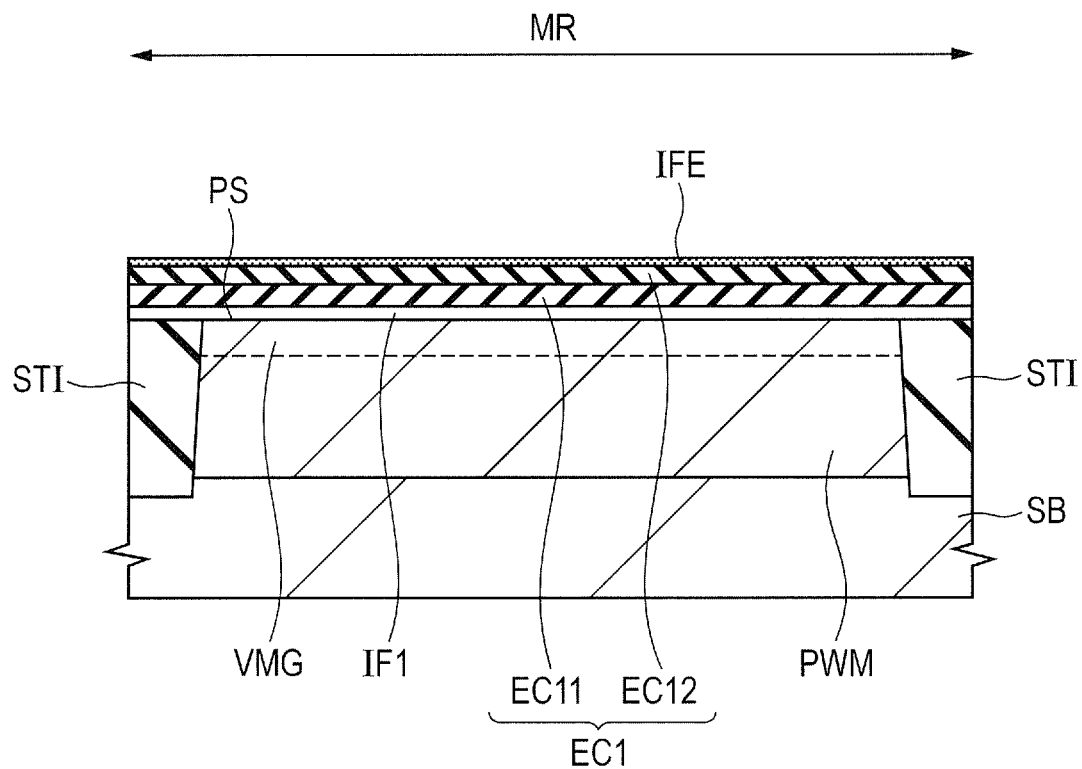
FIG. 11 is a cross-sectional view of the main portion of the semiconductor device during the manufacturing process, subsequent to FIG. 10.
Figure 12:
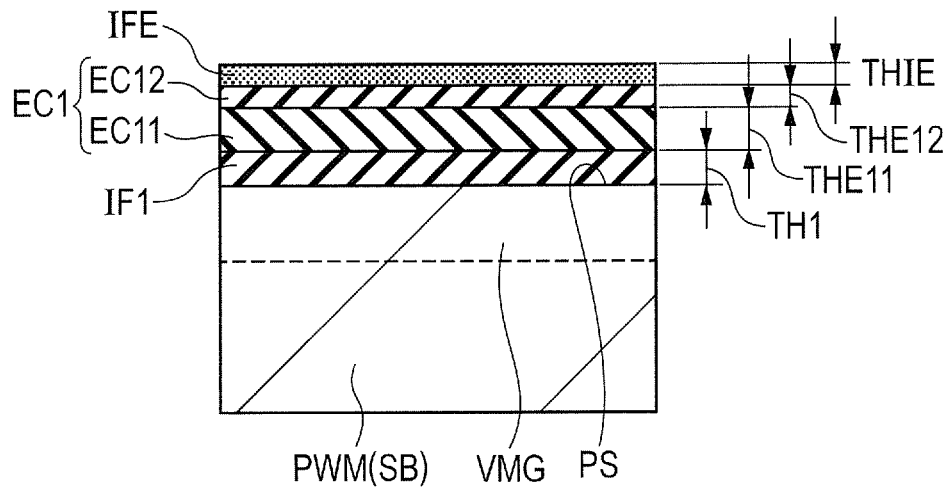
FIG. 12 is an enlarged cross-sectional view of the main portion of the semiconductor device during the manufacturing process, illustrated in FIG. 11.

Subsequently, the insulating film IFE is formed by liquid processing that uses processing liquid containing water, that is, wet processing, as illustrated in FIGS. 11 and 12 (Step S24 in FIG. 5). In this Step S24, the insulating film IFE is formed on the charge storage film EC12a in the memory forming region MR.

The insulating film IFE is an insulating film containing silicon and oxygen, and is preferably formed of silicon oxide or silicon oxynitride. Hereinafter, a method is described which performs liquid processing, that is, wet processing for semiconductor substrates one by one by using a single-wafer liquid processing equipment.

First, the semiconductor substrate SB after being subjected to Step S23 is held by a wafer stage (not illustrated) provided in the liquid processing equipment (not illustrated). Subsequently, while the semiconductor substrate SB is rotated together with the wafer stage, pure water maintained preferably at a room temperature, that is, 23° C. is supplied as the processing liquid to the top surface PS of the semiconductor substrate SB from a nozzle (not illustrated) provided in the liquid processing equipment preferably for about 30 seconds.

Liquid processing, that is, wet processing is performed for the top surface of the charge storage film EC12a formed of silicon nitride, for example, by using the supplied processing liquid, thereby oxidizing the portion (surface-layer portion) of the charge storage film EC12a to form the insulating film IFE having the thickness THIE. In this process, the portion of the charge storage film EC12a, which has not been oxidized, remains as the charge storage film EC12 below the insulating film IFE, as illustrated in FIGS. 11 and 12.

The thickness THIE of the insulating film IFE formed by this liquid processing is a magnitude corresponding to at least one atomic layer, and is about 0.1 to 0.5 nm. Therefore, assuming that the thickness THE12a of the charge storage film EC12a before oxidation is 0.2 to 1.0 nm, the thickness THE12 of the charge storage film EC12 remaining below the insulating film IFE without being oxidized is about 0.1 to 0.5 nm. The charge storage film EC1 is formed by the charge storage film EC12 remaining on the charge storage film EC11 and the charge storage film EC11.

Thereafter, after supply of the processing liquid is stopped, the semiconductor substrate SB is further rotated to be shaken off and dried preferably for about 20 seconds. In this manner, a dry process is performed. Thereafter, rotation of the semiconductor substrate SB is stopped, and the semiconductor substrate SB is detached from the wafer stage.

The processing liquid containing water described here is processing liquid for forming an oxide film. In a case of using pure water as the processing liquid, it is possible to set the temperature of the processing liquid supplied onto the top surface PS of the semiconductor substrate SB to a room temperature, that is, 23° C. or higher and 100° C. or lower. As for the definition of pure water, the resistivity of pure water at a room temperature can be preferably set to 10 MΩ cm or more, and more preferably to 18 MΩ cm or more.

It can be also considered that the insulating film IFE is formed by natural oxidation in which a film is left in the air, or thermal oxidation or CVD, for example. However, natural oxidation requires a processing time of about 24 hours, thus lowering throughput in a manufacturing process of a semiconductor device. In thermal oxidation or CVD, the thickness of an obtained oxide film is several nanometers or more. In other words, it is difficult to form a thin oxide film.

On the other hand, the thickness THIE of the insulating film IFE formed by the above liquid processing is a magnitude corresponding to at least one atomic layer, and is about 0.1 to 0.5 nm, but is smaller than an upper limit of the thickness that allows electrons or holes to pass through the insulating film by tunneling. Further, the thickness THIE of the insulating film IFE is smaller than the thickness of THE1 of the charge storage film EC1 included by the charge storage films EC11 and EC12.

Therefore, it is possible to easily inject electrons or holes from the semiconductor substrate SB to the charge storage film EC2 and to prevent the injected electrons or holes from escaping from the charge storage film EC2 to the semiconductor substrate SB.

As described above, in Step S24, it is possible to form the insulating film IFE that is very thin with good controllability of the thickness by the above liquid processing in a short time.

Further, by performing liquid processing for the semiconductor substrate SB with the processing liquid, particles adhering to the top surface of the charge storage film EC12a can be removed. Consequently, the top surface of the charge storage film EC12 can be made smooth. Therefore, reliability of a MONOS transistor can be improved.

As the processing liquid for forming an oxide film, it is possible to use various types of processing liquid containing water, for example, processing liquid containing ozone ($O_3$) water or hydrogen peroxide ($H_2O_2$) solution, as described later in a modification.

In the above example, a method of performing liquid processing, that is, wet processing for semiconductor substrates one by one by using a single-wafer liquid processing equipment is described. However, a batch type liquid processing equipment may be used in place of the single-wafer liquid processing equipment to perform liquid processing, that is, wet processing for a plurality of semiconductor substrates at once.

Figure 13:
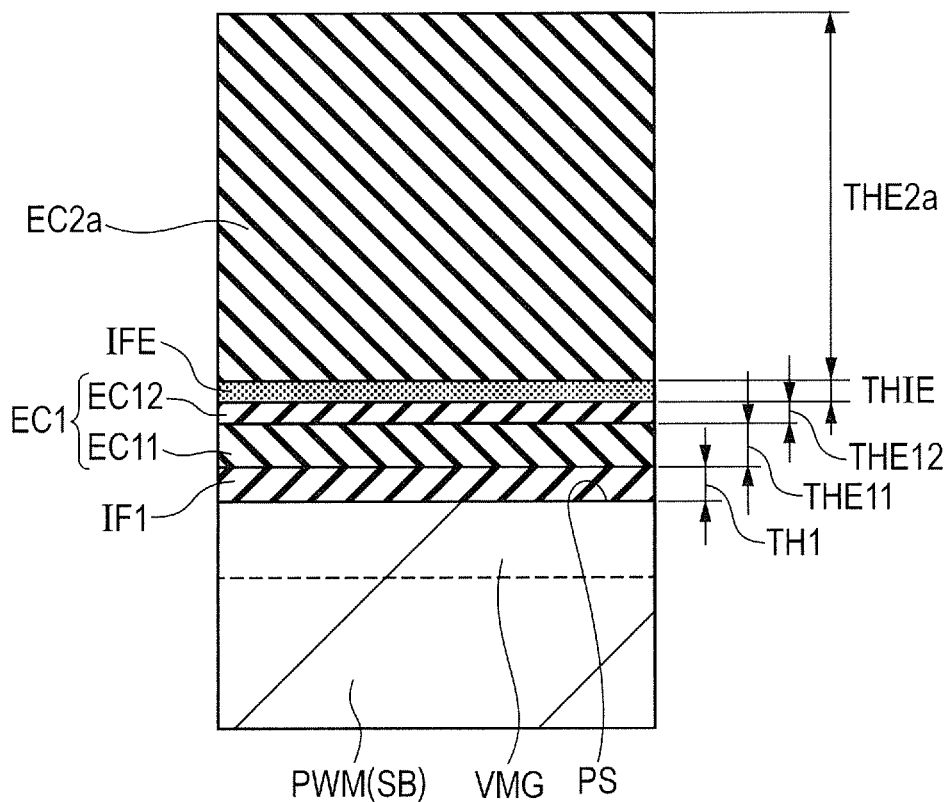
FIG. 13 is an enlarged cross-sectional view of the main portion of the semiconductor device during the manufacturing process, subsequent to FIG. 12.

Subsequently, a charge storage film EC2a is formed as illustrated in FIG. 13 (Step S25 in FIG. 5). In this Step S25, the charge storage film EC2a is formed on the insulating film IFE in the memory forming region MR.

Here, the charge storage film EC2a is the charge storage film EC2 before oxidation. The insulating film IF2 according to the present embodiment is formed by oxidizing a portion (surface layer portion) of a charge storage film in the next Step S26. Therefore, the charge storage film before oxidation, which includes the portion to be oxidized to form the insulating film IF2 and a portion to remain as the charge storage film EC2 below the insulating film IF2 without being oxidized, is referred to as the charge storage film EC2a.

The charge storage film EC2a is an insulating film containing silicon and nitrogen, and is preferably formed of silicon nitride. The charge storage film EC2a can be formed by CVD, for example. Preferably, the charge storage film EC2a can be formed by LPCVD method that uses dichlorosilane ($SiH_2Cl_2$) gas and ammonia ($NH_3$) gas as material gases at about 650° C.

Alternatively, the charge storage film EC2a can be also formed by ALD method that uses dichlorosilane ($SiH_2Cl_2$) gas and ammonia ($NH_3$) gas as material gases or LPCVD method that uses silane ($SiH_4$) gas and ammonia gas as material gases, for example.

The thickness THE2a of the charge storage film EC2a is preferably about 9 nm. In a case of forming a silicon nitride film having such a thickness, LPCVD method that uses dichlorosilane ($SiH_2Cl_2$) gas and ammonia ($NH_3$) gas as material gases is preferable from viewpoints of the film forming speed and the film quality.

Figure 14:
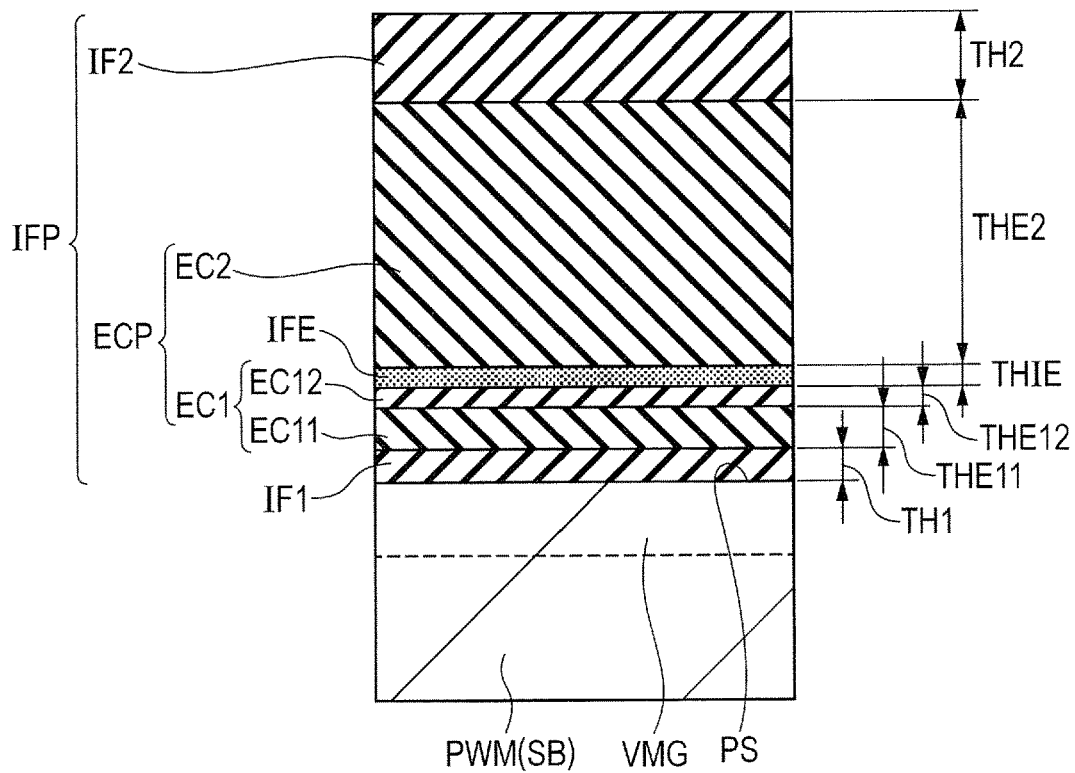
FIG. 14 is an enlarged cross-sectional view of the main portion of the semiconductor device during the manufacturing process, subsequent to FIG. 13.

Subsequently, the insulating film IF2 is formed as illustrated in FIG. 14 (Step S26 in FIG. 5). In this Step S26, the insulating film IF2 is formed on the charge storage film EC2 in the memory forming region MR.

The insulating film IF2 is an insulating film containing silicon and oxygen, and is preferably formed of silicon oxide. Preferably, the insulating film IF2 can be formed by thermal oxidation such as wet oxidation, or ISSG oxidation. Wet oxidation is a method of performing a heat treatment in a gas in which deionized water vapor is added to oxygen gas. Alternatively, the insulating film IF2 can be preferably formed by the HTO (High Temperature Oxide) process.

In the present embodiment, the top surface of the charge storage film EC2a formed of silicon nitride, for example, is oxidized, thereby oxidizing a portion (surface-layer portion) of the charge storage film EC2a to form the insulating film IF2 with the thickness TH2. In this process, the portion of the charge storage film EC2a, which has not been oxidized, remains as the charge storage film EC2 below the insulating film IF2 as illustrated in FIG. 14.

The thickness TH2 of the insulating film IF2 formed by this oxidation is about 3 nm. Therefore, assuming that the thickness THE2a of the charge storage film EC2a before oxidation is about 9 nm, the thickness THE2 of the charge storage film EC2 remaining below the insulating film IF2 without being oxidized is about 6 nm.

Therefore, it is possible to form the insulating film IF2 of silicon oxide that is dense and excellent in film quality.

By the above processes, it is possible to form the insulating film portion IFP that includes the insulating film IF1, the charge storage film EC11, the charge storage film EC12, the insulating film IFE, the charge storage film EC2, and the insulating film IF2, on the top surface PS of the semiconductor substrate SB. Further, in the insulating film portion IFP, the charge storage portion ECP is formed which is included by the charge storage film EC1, the insulating film IFE, and the charge storage film EC2.

Figure 15:
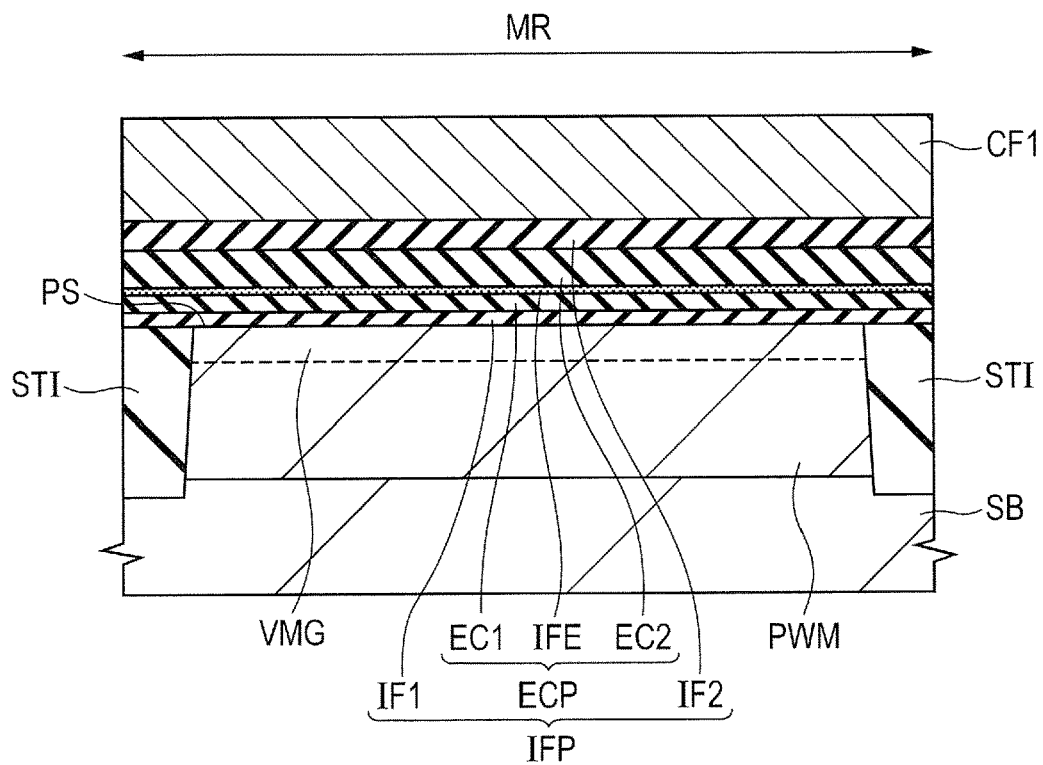
FIG. 15 is a cross-sectional view of the main portion of the semiconductor device during the manufacturing process, subsequent to FIG. 14.
Figure 16:
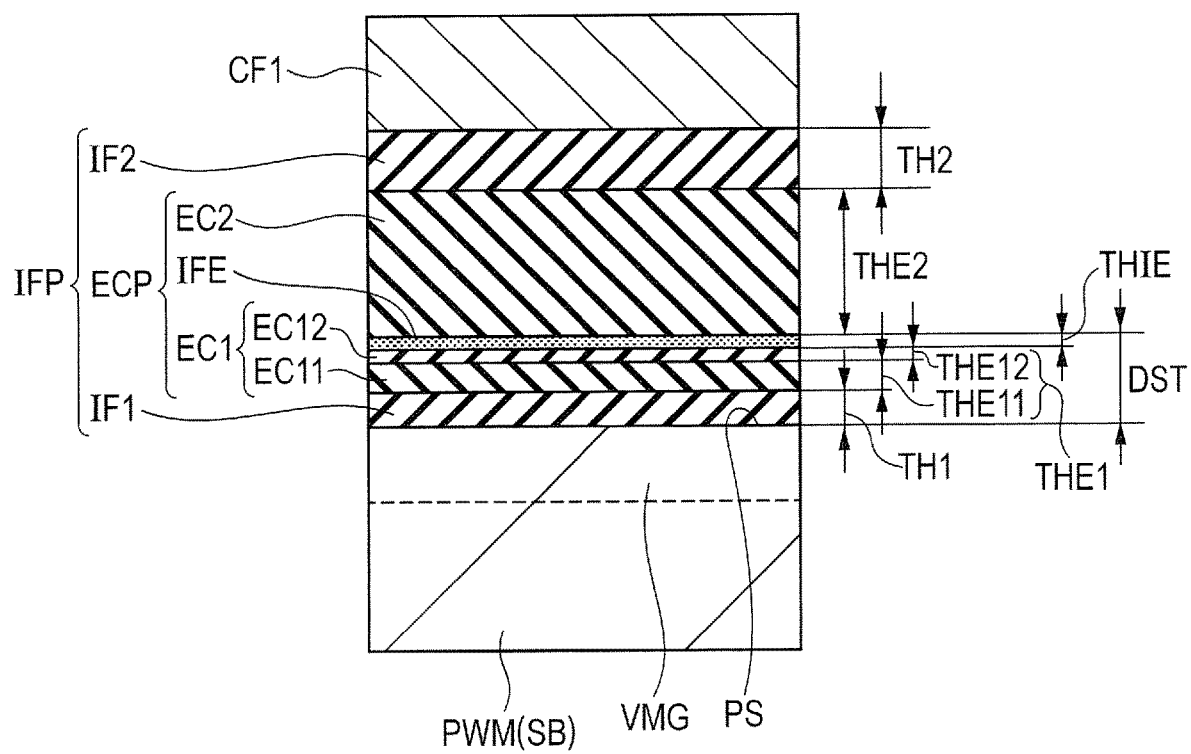
FIG. 16 is an enlarged cross-sectional view of the main portion of the semiconductor device during the manufacturing process, illustrated in FIG. 15.

Subsequently, the conductive film CF1 is formed as illustrated in FIGS. 15 and 16 (Step S5 in FIG. 4). In this Step S5, the conductive film CF1 for a gate electrode is formed on the insulating film portion IFP in the memory forming region MR.

The conductive film CF1 is preferably formed by a polycrystalline silicon film, that is, a polysilicon film. This conductive film CF1 can be formed by CVD or the like. It is possible to obtain the thickness of the conductive film CF1 which is a sufficient magnitude for covering the insulating film portion IFP. Further, when the conductive film CF1 is formed, the conductive film CF1 may be formed as an amorphous silicon film and be then changed from the amorphous silicon film into a polycrystalline silicon film by a heat treatment performed later.

It is preferable to use a conductive film into which n-type impurities, such as phosphorous (P) or arsenic (As), are introduced to achieve a low resistivity, as the conductive film CF1.

The impurities can be introduced during or after formation of the conductive film CF1. In a case of introducing the impurities during formation of the conductive film CF1, a doping gas is included in a gas for forming the conductive film CF1. In this manner, it is possible to form the conductive film CF1 with the impurities introduced thereinto.

Meanwhile, in a case of introducing the impurities after formation of a silicon film, the silicon film is formed without intentionally introducing the impurities, and thereafter the impurities are introduced into this silicon film by ion implantation or the like. In this manner, the conductive film CF1 with the impurities introduced thereinto can be formed.

In a case of forming a p-channel MONOS transistor, it is preferable to use a conductive film into which p-type impurities, such as boron (B), are introduced to achieve a low resistivity.

Figure 17:
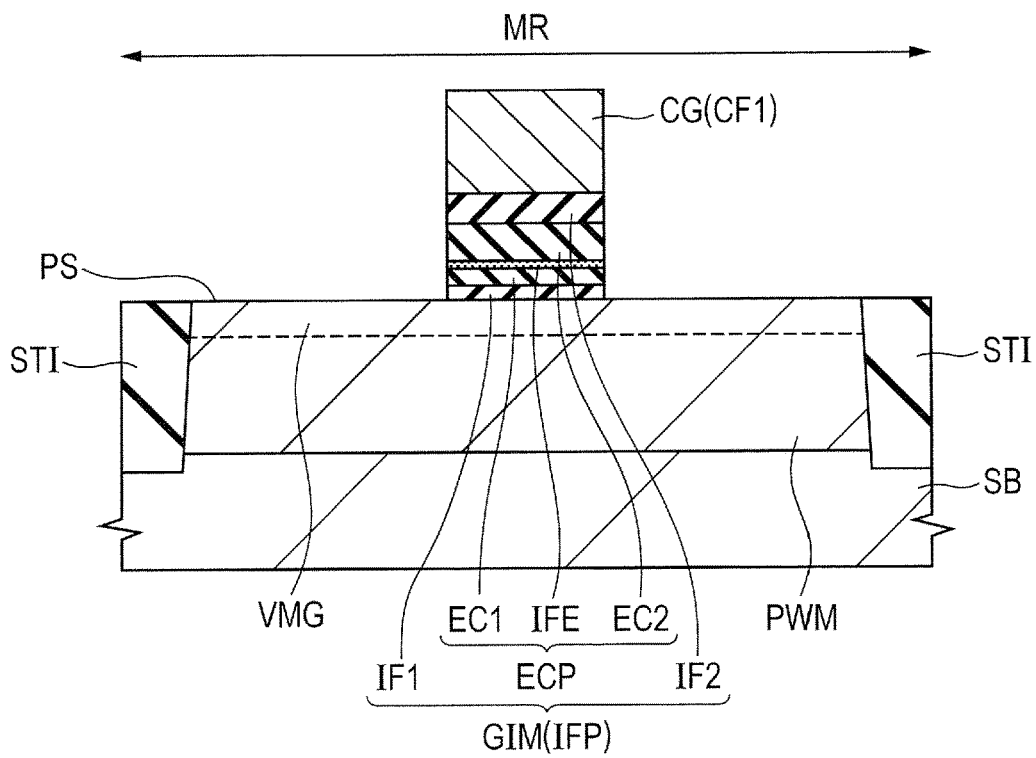
FIG. 17 is a cross-sectional view of the main portion of the semiconductor device during the manufacturing process, subsequent to FIG. 16.
Figure 18:
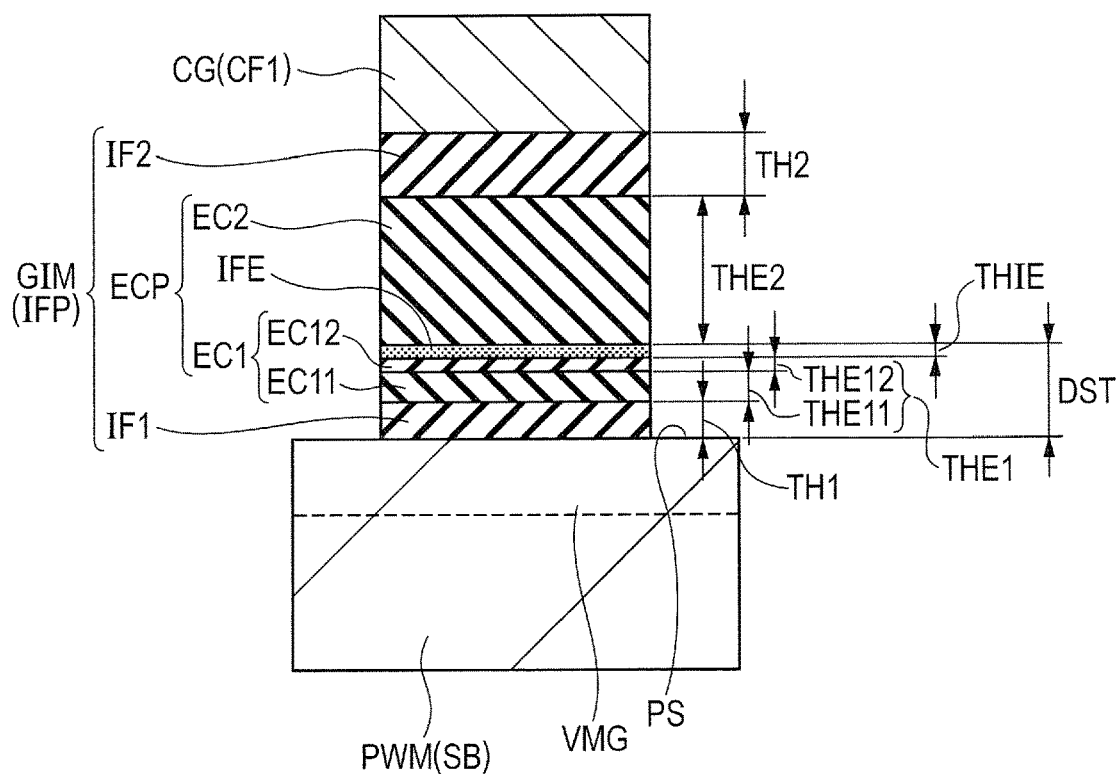
FIG. 18 is an enlarged cross-sectional view of the main portion of the semiconductor device during the manufacturing process illustrated in FIG. 17.

Subsequently, the conductive film CF1 and the insulating film portion IFP are patterned in the memory forming region MR as illustrated in FIGS. 17 and 18 (Step S6 in FIG. 4).

In this Step S6, a resist film (not illustrated) is applied on the top surface PS of the semiconductor substrate SB and is then patterned by photolithography. The resist film is patterned in such a manner that a portion of the conductive film CF1 arranged in a region of the memory forming region where the gate electrode CG is to be formed is covered by the resist film and a portion of the conductive film CF1 arranged in a region other than the region where the gate electrode CG is to be formed is exposed from the resist film.

In this Step S6, the conductive film CF1 and the insulating film portion IFP are then patterned by etching, preferably dry etching with the patterned resist film (not illustrated) used as mask, as illustrated in FIGS. 17 and 18. Alternatively, after the conductive film CF1 is etched to be patterned by dry etching, the insulating film portion IFP may be etched to be patterned by wet etching.

By this patterning, in the memory forming region MR are formed the gate electrode CG included by the conductive film CF1 and the gate insulating film GIM included by the insulating film portion IFP between the gate electrode CG and the p-well PWM of the semiconductor substrate SB.

That is, the gate electrode CG is formed on the p-well PWM of the semiconductor substrate SB in the memory forming region MR via the gate insulating film GIM. Thereafter, the patterned resist film (not illustrate) is removed preferably by asking.

Figure 19:
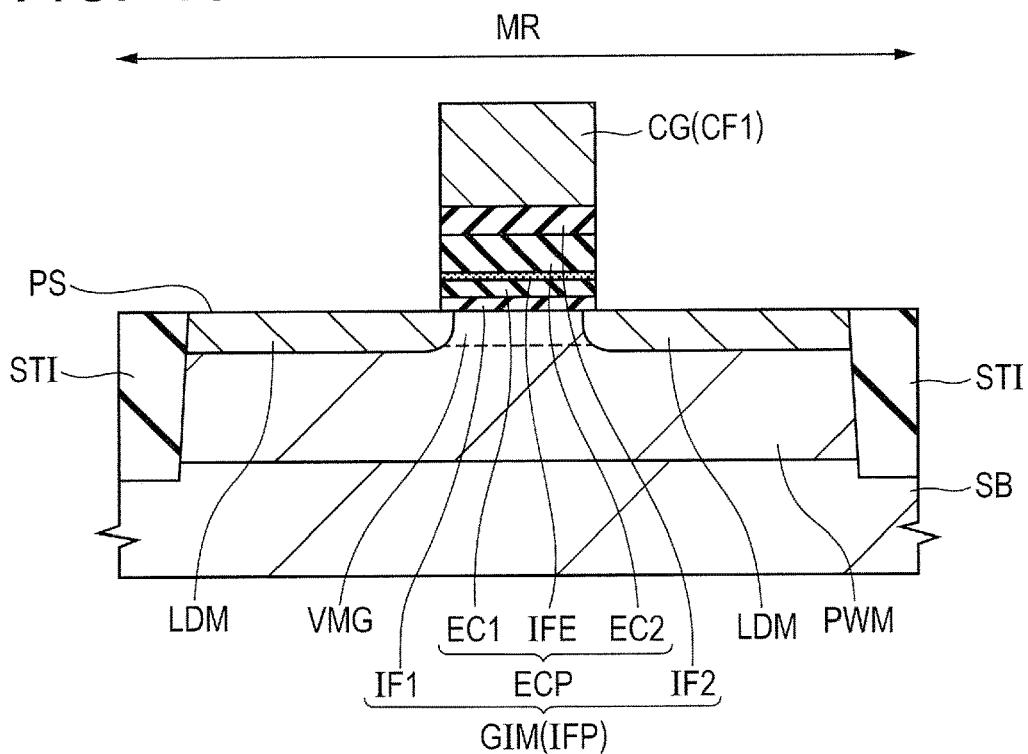
FIG. 19 is a cross-sectional view of the main portion of the semiconductor device during the manufacturing process, subsequent to FIG. 18.

Subsequently, the n$^-$-type semiconductor region LDM is formed as illustrated in FIG. 19 (Step S7 in FIG. 4). In this Step S7, n-type impurities, such as arsenic (As) or phosphorous (P), are ion-implanted into the semiconductor substrate SB in the memory forming region MR by using the gate electrode CG as mask, as illustrated in FIG. 19.

By this ion implantation, the n$^-$-type semiconductor regions LDM are formed in upper layer portions of the p-wells PWM located on respective sides of the gate electrode CG in the memory forming region MR in a plan view. The n$^-$-type semiconductor regions LDM are formed to be aligned with both the side surfaces of the gate electrode CG, respectively.

In a case of forming a p-channel MONOS transistor, p-type impurities, such as boron (B), are ion-implanted into the semiconductor substrate SB in the memory forming region MR by using the gate electrode CG as mask.

Figure 20:
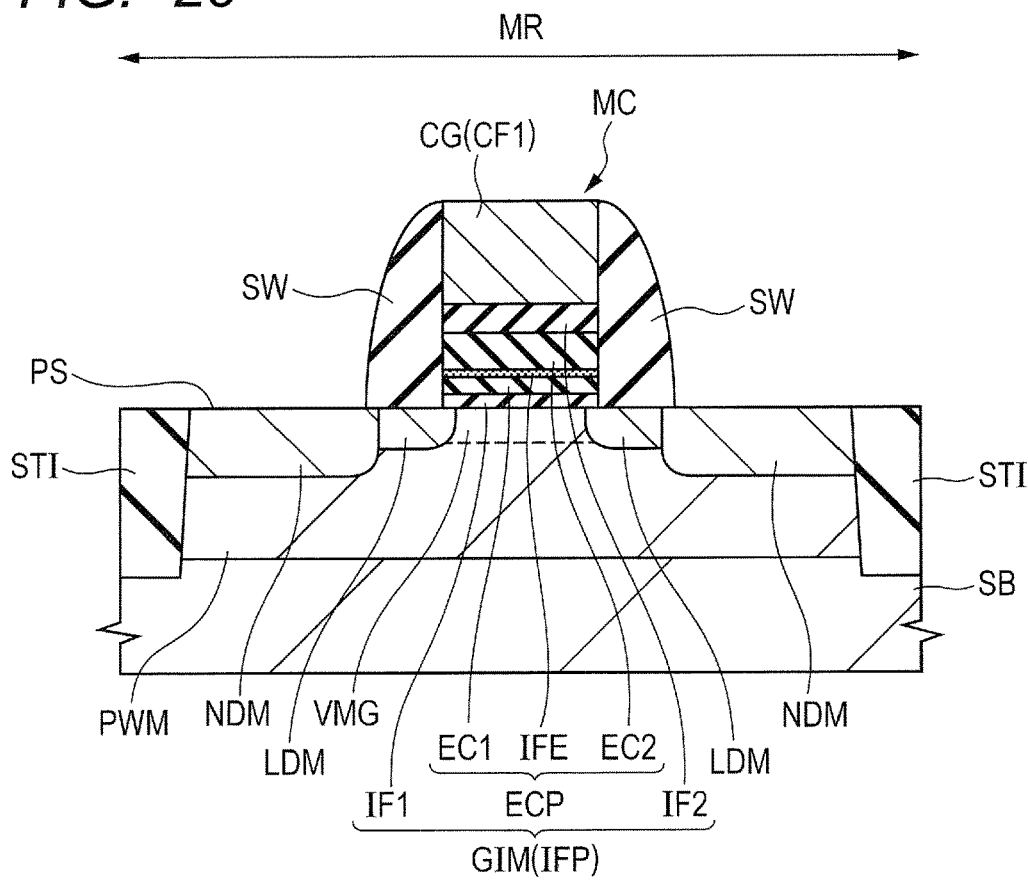
FIG. 20 is a cross-sectional view of the main portion of the semiconductor device during the manufacturing process, subsequent to FIG. 19.

Subsequently, the sidewall spacer SW is formed as illustrated in FIG. 20 (Step S8 in FIG. 4).

First, an insulating film for the sidewall spacer is formed on the entire top surface PS of the semiconductor substrate SB in this Step S8. The insulating film is preferably formed by an insulating film of silicon oxide, an insulating film of silicon nitride, or a multilayered film of those films. In this formation, the insulating film is formed on a top surface of the n$^-$-type semiconductor region LDM, the side surfaces of the gate insulating film GIM, and the side surfaces and the top surface of the gate electrode CG in the memory forming region MR.

In this Step S8, the insulating film is then etched back, preferably by anisotropic etching, to selectively leave the insulating film on the side surfaces of the gate electrode CG in the memory forming region MR, thereby forming the sidewall spacers SW included by the insulating film on the side surfaces of the gate electrode CG, as illustrated in FIG. 20. With the sidewall spacers SW, the n$^+$-semiconductor region NDM to be formed in Step S9 described later is electrically insulated from the gate electrode CG.

Subsequently, the n$^+$-type semiconductor region NDM is formed as illustrated in FIG. 20 (Step S9 in FIG. 4). In this Step S9, n-type impurities, such as arsenic (As) or phosphorous (P), are ion-implanted into the semiconductor substrate SB in the memory forming region MR by using the gate electrode CG and the sidewall spacers SW as mask.

By this ion implantation, the n$^+$-type semiconductor region NDM is formed in an upper layer portion of the p-well PWM located on the opposite side of the sidewall spacer SW to the gate electrode CG in the memory forming region MR in a plan view. The n$^+$-type semiconductor region NDM is formed to be aligned with the sidewall spacer SW in the memory forming region MR.

In this manner, the MONOS transistor MC is formed by the p-well PWM, the p-type semiconductor region VMG, the gate insulating film GIM, the gate electrode CG, the sidewall spacer SW, the n$^-$-type semiconductor region LDM, and the n$^+$-type semiconductor region NDM in the memory forming region MR, as illustrated in FIG. 20. Further, a memory cell as a non-volatile memory is formed by the MONOS transistor MC.

In a case of forming a p-channel MONOS transistor, p-type impurities, such as boron (B), are ion-implanted into the semiconductor substrate SB in the memory forming region MR by using the gate electrode CG and the sidewall spacer SW as mask.

Figure 21:
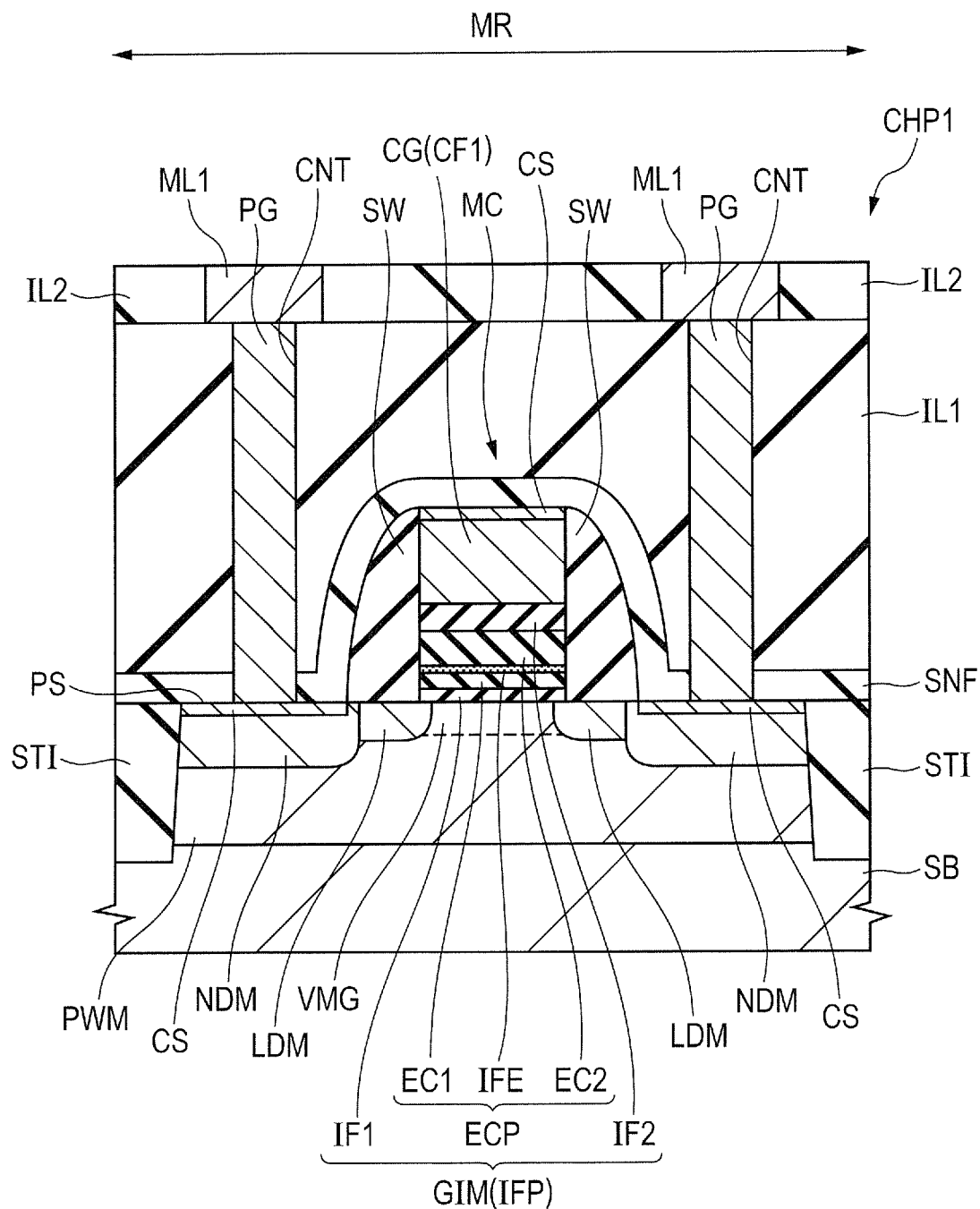
FIG. 21 is a cross-sectional view of the main portion of the semiconductor device during the manufacturing process, subsequent to FIG. 20.

Subsequently, the silicide film CS, the insulating film SNF, the interlayer insulating film IL1, and the plug PG are formed as illustrated in FIG. 21 (Step S10 in FIG. 4).

In this Step S10, the silicide film CS is formed first, as illustrated in FIG. 21. A metal film is formed on the entire top surface PS of the semiconductor substrate SB to cover the n$^+$-semiconductor region NDM, the gate electrode CG, and the sidewall spacer SW.

The metal film is formed by a cobalt (Co) film, a nickel (Ni) film, or a nickel platinum alloy film, for example, and can be formed by sputtering or the like. Then, a heat treatment is performed for the semiconductor substrate SB, thereby causing an upper layer portion of each of the n$^+$-semiconductor region NDM and the gate electrode CG to react with the metal film. Thereafter, an unreacted metal film is removed.

By performing this process, i.e., a so-called salicide (Self-Aligned Silicide) process, the silicide film CS is formed on each of the n$^+$-type semiconductor region NDM and the gate electrode CG as illustrated in FIG. 21. The silicide film CS can be a cobalt silicide layer, a nickel silicide layer, or a platinum-added nickel silicide layer, for example.

Subsequently, the insulating film SNF is formed in this Step S10, as illustrated in FIG. 21. The insulating film SNF is formed on the entire top surface PS of the semiconductor substrate SB to cover the n$^+$-semiconductor region NDM, the gate electrode CG, and the sidewall spacer SW. The insulating film SNF is preferably formed of silicon nitride. The insulating film SNF can be preferably formed by CVD.

In this Step S10, the interlayer insulating film IL1 is then formed on the insulating film SNF as illustrated in FIG. 21. The interlayer insulating film IL1 is preferably formed by an insulating film of silicon oxide, a multilayered film of an insulating film of silicon nitride and an insulating film of silicon oxide, or the like. After the interlayer insulating film IL1 is formed by CVD, for example, the top surface of the interlayer insulating film IL1 is flattened.

Subsequently, the plug PG extending through the interlayer insulating film IL1 is formed in this Step S10, as illustrated in FIG. 21. First, the interlayer insulating film IL1 is dry-etched by using a resist pattern (not illustrated) formed on the interlayer insulating film IL1 by photolithography as etching mask, thereby forming the contact hole CNT in the interlayer insulating film IL1. Then, the plug PG is formed in the contact hole CNT as a conductor portion, which is conductive and is formed of tungsten (W), for example.

In order to form the plug PG, a barrier conductor film formed by a titanium (Ti) film, a titanium nitride (TiN) film, or a multilayered film of those films, for example, is formed on the interlayer insulating film IL1 preferably including the inside of the contact hole CNT.

Then, a main conductor film formed by a tungsten (W) film, for example, is formed on this barrier conductor film to be embedded in the contact hole CNT, and unnecessary portions of the main conductor film and the barrier conductor film on the interlayer insulating film IL1 are removed by CMP or an etch-back method. In this manner, the plug PG can be formed. FIG. 21 illustrates the barrier conductor film and the main conductor film that include the plug PG in an integrated manner for simplifying the drawing.

The contact hole CNT and the plug PG embedded therein are formed on the $n^+$-type semiconductor region NDM, and is also formed on the gate electrode CG and the like although not illustrated. A portion of the silicide film CS, located above the $n^+$-type semiconductor region NDM, for example, is exposed on the bottom of the contact hole CNT. Also, a portion of the silicide film CS above the gate electrode CG is exposed, although not illustrated.

Subsequently, the interlayer insulating film IL2 and the wiring ML1 are formed as illustrated in FIG. 21 (Step S11 in FIG. 4).

In this Step S11, the interlayer insulating film IL2 preferably formed of silicon oxide is formed on the interlayer insulating film IL1 in which the plug PG is formed, as illustrated in FIG. 21. A wiring groove is then formed in the interlayer insulating film IL2 by photolithography and etching. Thereafter, a copper (Cu) film is formed on the interlayer insulating film IL2 including inside of the wiring groove.

Thereafter, the copper film exposed on the interlayer insulating film IL2 other than the inside of the wiring groove is polished to be removed, preferably by CMP, so that the copper film is left only in the wiring groove formed in the interlayer insulating film IL2. In this manner, the wiring ML1 can be formed. The semiconductor device according to the present embodiment can be formed in this manner.

In the present embodiment, an example of forming the wiring ML1 by the copper film is described. However, the wiring ML1 may be formed by an aluminum (Al) film, for example.

STUDY EXAMPLES

Semiconductor devices of study examples studied by the inventors of the present application are described.

Figure 22:
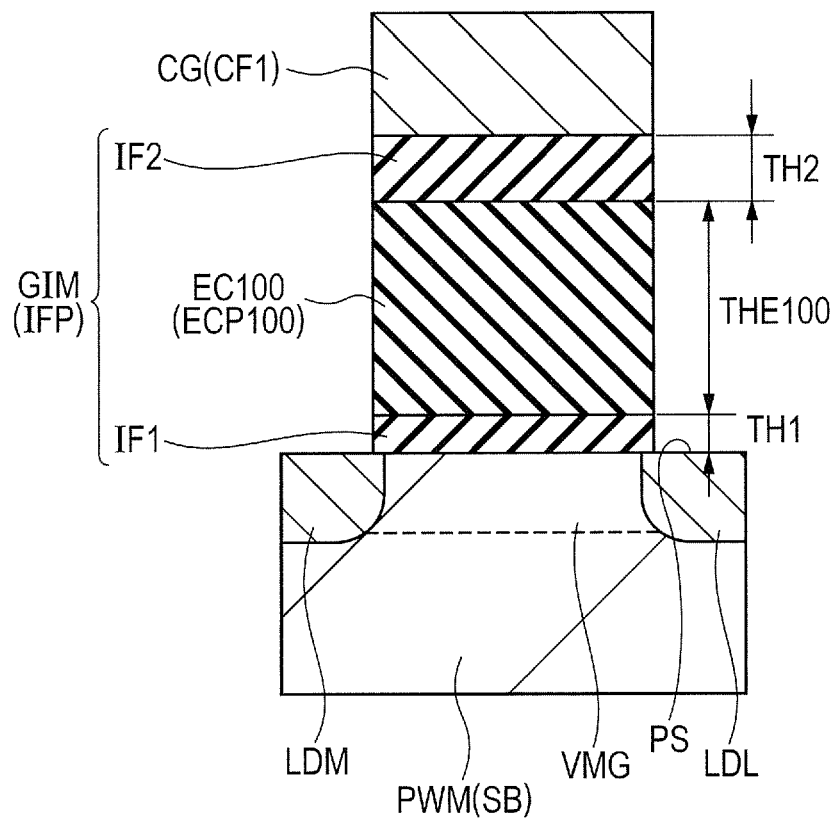
FIG. 22 is a cross-sectional view of a main portion of a semiconductor device according to a first study example.
Figure 23:
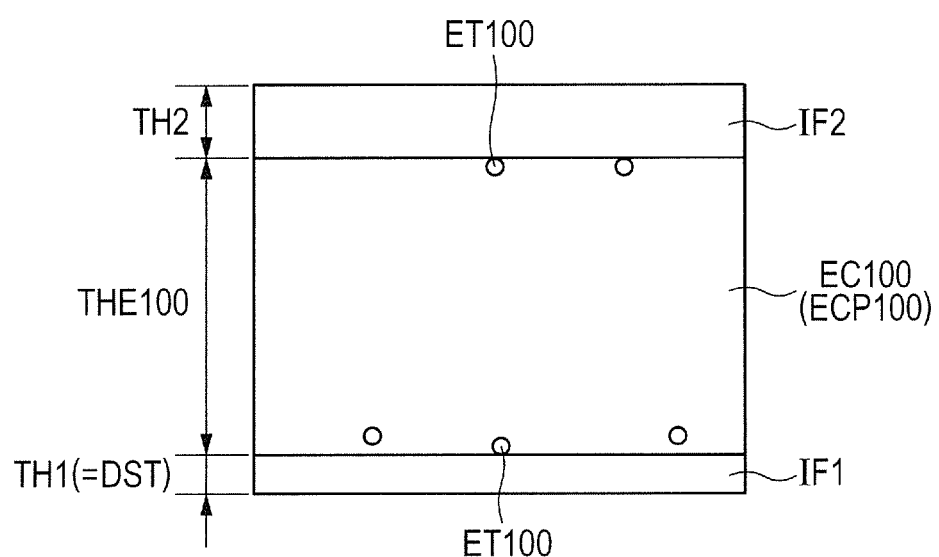
FIG. 23 is a cross-sectional view schematically illustrating a distribution of electron trap positions in a charge storage portion of the semiconductor device of the first study example.
Figure 24:
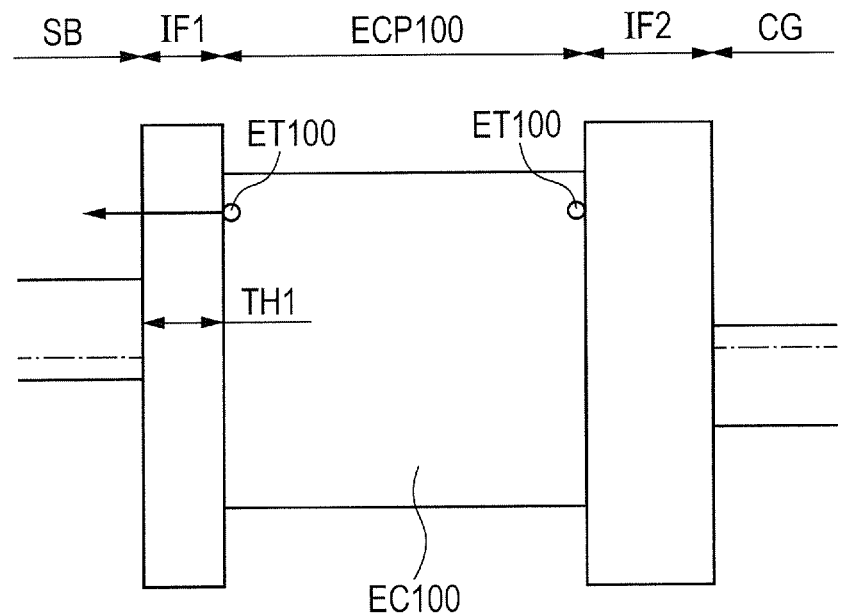
FIG. 24 is a band diagram illustrating an energy distribution in a write state of the semiconductor device of the first study example.

FIG. 22 is an enlarged cross-sectional view that enlarges and illustrates a gate insulating film GIM and its surroundings in a cross-sectional view of a main portion of a semiconductor device of a first study example. FIG. 23 is a cross-sectional view schematically illustrating a distribution of electron trap positions in a charge storage portion of the semiconductor device of the first study example. FIG. 24 is a band diagram illustrating an energy distribution in a write state of the semiconductor device of the first study example.

Figure 25:
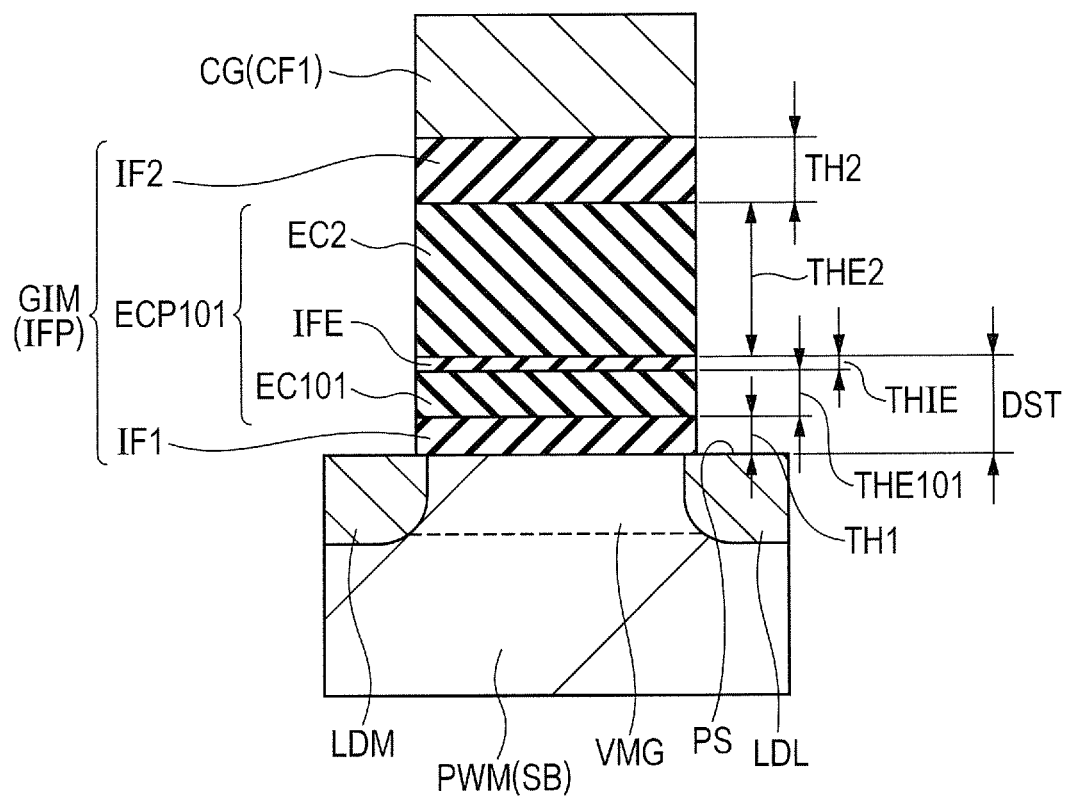
FIG. 25 is a cross-sectional view of a main portion of a semiconductor device according to a second study example.
Figure 26:
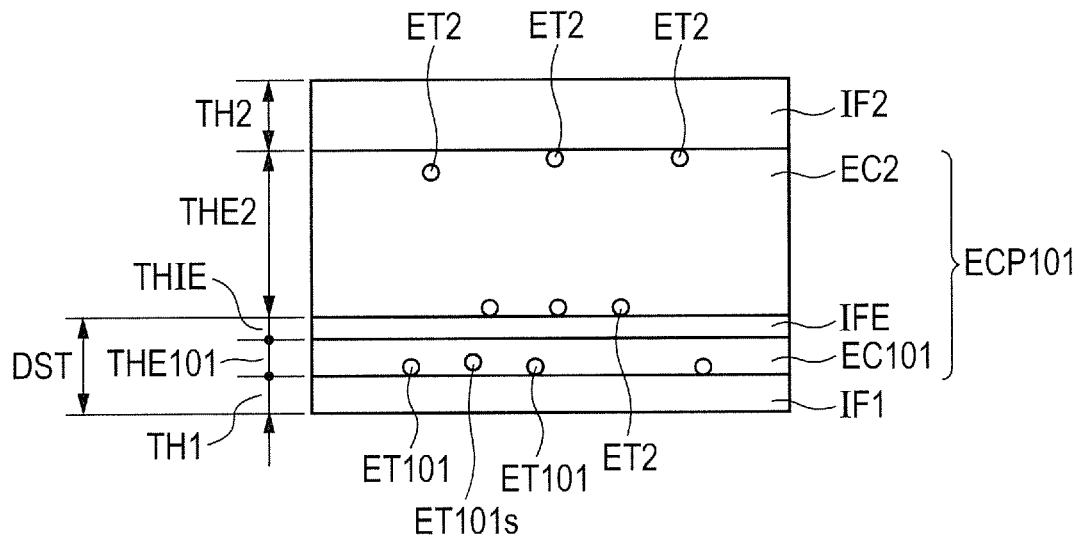
FIG. 26 is a cross-sectional view schematically illustrating a distribution of electron trap positions in a charge storage portion of the semiconductor device of the second study example.
Figure 27:
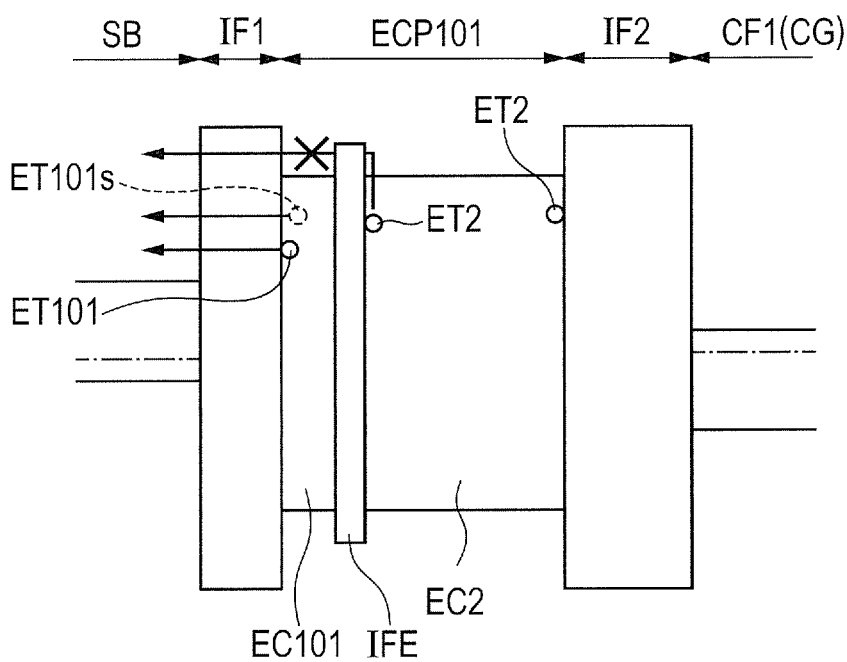
FIG. 27 is a band diagram illustrating an energy distribution in a write state of the semiconductor device of the second study example.

FIG. 25 is an enlarged cross-sectional view that enlarges and illustrates a gate insulating film GIM and its surroundings in a cross-sectional view of a main portion of a semiconductor device of a second study example. FIG. 26 is a cross-sectional view schematically illustrating a distribution of electron trap positions in a charge storage portion of the semiconductor device of the second study example. FIG. 27 is a band diagram illustrating an energy distribution in a write state of the semiconductor device of the second study example.

First Study Example

In the semiconductor device of the first study example, the gate insulating film GIM includes the insulating film IF1 formed on the top surface PS of the semiconductor substrate SB, a charge storage film EC100 formed on the insulating film IF1, and the insulating film IF2 formed on the charge storage film EC100. A charge storage portion ECP100 is formed by the charge storage film EC100.

The insulating film IF1 is preferably formed of silicon oxide, the charge storage film EC100 is preferably formed of silicon nitride, and the insulating film IF2 is preferably formed of silicon oxide. Therefore, the gate insulating film GIM has a structure that is also called an ONO (Oxide-Nitride-Oxide) film.

Electron trap positions ET100 formed by an impurity level, for example, are formed in the band gap of the charge storage film EC100 around an interface with the insulating film IF1 and an interface with the insulating film IF2.

The thickness TF1 of the insulating film IF1 as a bottom oxide film is preferably as small as about 2 nm, which enables a direct tunneling erase operation of holes from the semiconductor substrate SB to the charge storage film EC100.

Further, the thickness THE100 of the charge storage film EC100 is 16 nm, for example, and the thickness TH2 of the insulating film IF2 as a top oxide film is about 3 nm, for example.

In the semiconductor device of the first study example, the charge storage portion ECP100 is included by the charge storage film EC100 formed by a single layer. In this case, in order to enable an operation in which holes directly tunnel through the insulating film IF1 to achieve an erase operation, that is, the direct tunneling erase operation, it is necessary to reduce the thickness TH1 of the insulating film IF1 to about 2 nm, preferably.

However, such a small thickness TH1 makes the distance between the electron trap position EC100 formed in the charge storage film ET100 around the interface with the insulating film IF1 and the top surface of the semiconductor substrate SB short. Therefore, electrons can easily tunnel from the charge storage film EC100 to the semiconductor substrate SB in a write state, that is, while data is retained after injection of the electrons, and it is thus impossible to improve the data retention characteristics.

Accordingly, applications of the semiconductor device of the first study example are limited to so-called consumer products, for example, in which at an operating temperature of 85° C., a data retention time of 10 years is achieved and data rewriting can be performed 100,000 times. Further, in the semiconductor device of the first study example, holes can easily tunnel and escape from the charge storage film EC100 to the semiconductor substrate SB in an erase state.

Second Study Example

Meanwhile, in the semiconductor device of the second study example, the charge storage portion ECP is included by two layers of a charge storage film EC101 and the charge storage film EC2, and the insulating film IFE arranged therebetween, as illustrated in FIG. 27. The insulating film IFE is preferably formed of silicon oxide.

The charge storage film EC101 is formed by ALD method preferably at a low temperature of about 400° C. The charge storage film EC2 is formed by LPCVD method preferably at a high temperature of about 600° C.

The insulating film IFE is formed by performing liquid processing, that is, wet processing for the top surface of the charge storage film EC101 to oxidize a portion of the charge storage film EC101. Except for the above, the second study example is the same as the first study example.

As illustrated in FIG. 27, the band gap of each of the insulating film IF1, the insulating film IFE, and the insulating film IF2 is larger than the band gap of any of the charge storage film EC101 and the charge storage film EC2, each formed by an insulating film.

Further, electron trap positions ET101 formed by an impurity level, for example, are formed in the band gap of the charge storage film EC101 around an interface with the insulating film IF1. Similarly, an electron trap position ET2 formed by an impurity level, for example, is formed in the band gap of the charge storage film EC2 around an interface with the insulating film IFE.

Therefore, in the second study example, it is possible to store charges formed by electrons at the electron trap position ET101 formed in the charge storage film EC101 and the electron trap position ET2 formed in the charge storage film EC2.

Further, assuming that the thickness TH1 of the insulating film IF1 is 2.0 nm, the thickness THE101 of the charge storage film EC101 is 1.5 nm, and the thickness THIE of the insulating film IFE is 0.5 nm in the semiconductor device of the second study example, a distance DST between the charge storage film EC2 and the semiconductor substrate SB, which is the total of these thicknesses, can be 4.0 nm. Meanwhile, in the semiconductor device of the first study example, the distance between the charge storage film EC100 and the semiconductor substrate SB is equal to the thickness TH1 of the insulating film IF1 and is about 2 nm.

It is more difficult for the charges stored at the electron trap position ET2 of the second study example to tunnel to the semiconductor substrate SB in a write state, that is, while data is retained after electron injection, as compared with the charges stored at the electron trap position ET100 of the first study example. Therefore, the semiconductor device of the second study example can improve the data retention characteristics as compared with the semiconductor device of the first study example.

Further, the thickness THIE of the insulating film IFE is smaller than the thickness of THE101 of the charge storage film EC101. Therefore, it is possible to make the thickness THIE of the insulating film IFE relatively small in the charge storage portion ECP. Accordingly, it is possible to cause electrons or holes to tunnel through the insulating film IF1, the charge storage film EC101, and the insulating film IFE, thereby easily injecting the electrons or the holes from the semiconductor substrate SB to the charge storage film EC2.

Furthermore, the thickness THE2 of the charge storage film EC2 is larger than the thickness THE101 of the charge storage film EC101, and the thickness THE101 of the charge storage film EC101 can be made relatively small in the charge storage portion ECP. Thus, when data is erased, it is possible to improve an efficiency of injecting holes from the p-well PWM of the semiconductor substrate SB into the charge storage film EC2.

That is, by providing the insulating film IFE and making the thickness THE101 of the charge storage film EC101 small, the distance DST from the top surface PS of the semiconductor substrate SB to the bottom surface of the charge storage film EC2 can be adjusted to an appropriate distance that can improve the data retention characteristics and an injection efficiency of electrons and holes.

Specifically, it is possible to arrange an electron trap position, arranged at a position away from the top surface of the semiconductor substrate SB by about 2 nm in the first study example, to be further away from the top surface of the semiconductor substrate SB by about 4 nm in the second study example. Therefore, it is hard for electrons to tunnel from the charge storage film EC2 to the semiconductor substrate SB in a write state, that is, while data is retained after injection of the electrons, and it is thus possible to improve the data retention characteristics in the semiconductor device of the second study example, as compared with the semiconductor device of the first study example.

Because it is necessary form the insulating film IFE to be as thin as possible in the second study example, the insulating film IFE is formed by oxidizing a portion (surface layer portion) of the charge storage film EC101. Therefore, the charge storage film E101 is formed as a silicon nitride film that is low in film density and can be easily oxidized to some extent. As a result of this, electron trap positions that are shallow in terms of energy are formed in the charge storage film EC101 to some extent (for example, electron trap positions ET101$s$.)

It is found that a phenomenon occurs in the semiconductor device of the second study example as a result of the above, in which the electrons trapped at the electron trap positions ET101$s$ pass through the insulating film IF1 because of direct tunneling to leak into the semiconductor substrate SB, lowering the data retention characteristics. Therefore, it is desirable that the number of the shallow electron trap positions ET101$s$ that are formed is minimized.

Meanwhile, when the film density of the charge storage film EC101 is made high, the number of the electron trap positions ET101$s$ that are shallow in terms of energy, originating from impurities and voids (spaces) in the silicon nitride film, is reduced and the above problem is eliminated. However, when the film density of the charge storage film EC101 is high, the voids (spaces) in the silicon nitride film are reduced, thus generating a secondary effect that it is hard for the charge storage film E101 to be oxidized. Therefore, when the film density of the charge storage film EC101 is made high, the insulating film IFE cannot be sufficiently formed, resulting in reduction of the electron trap positions ET2 formed around the interface between the insulating film IFE and the charge storage film EC2 and lowering of the data retention characteristics.

<Main Features of Present Embodiment>

The semiconductor device according to the present embodiment is described below, while being compared with the study examples.

(Configuration of Semiconductor Device)

Figure 28:
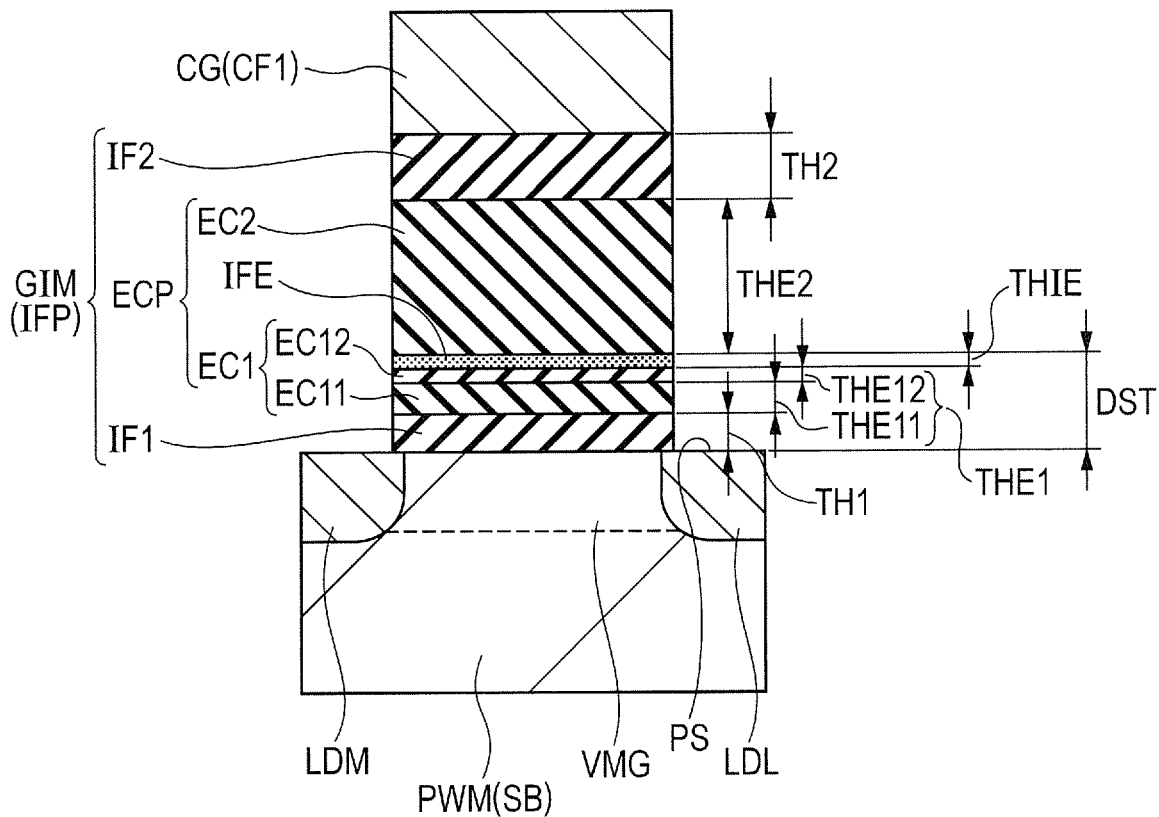
FIG. 28 is a cross-sectional view of a main portion of the semiconductor device according to the present embodiment.
Figure 29:
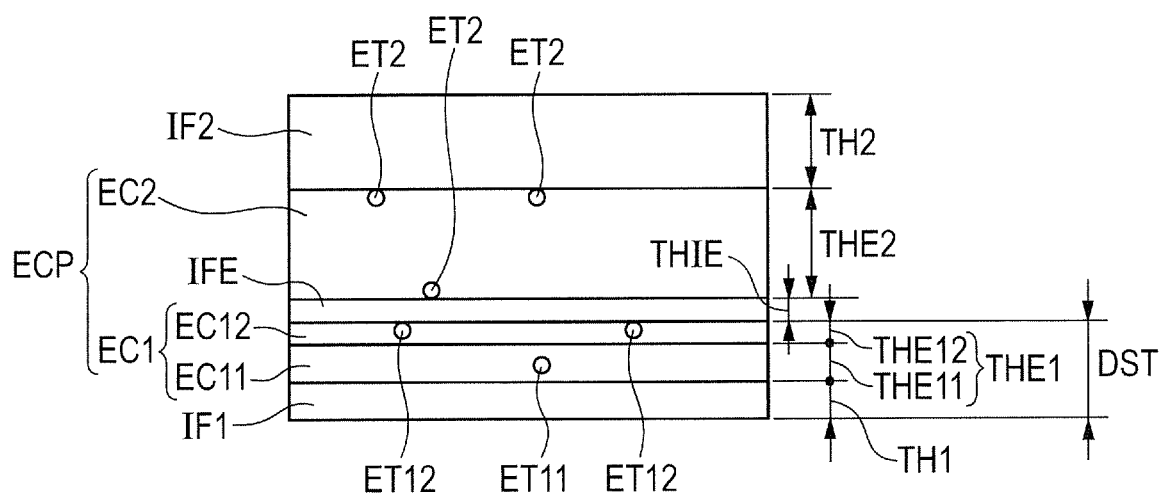
FIG. 29 is a cross-sectional view schematically illustrating a distribution of electron trap positions in a charge storage portion of the semiconductor device according to the present embodiment.

FIG. 28 is an enlarged cross-sectional view that enlarges and illustrates the gate insulating film GIM and its surroundings in the cross-sectional view of the main portion of the semiconductor device of the embodiment. FIG. 29 is a cross-sectional view schematically illustrating a distribution of electron trap positions in a charge storage portion of the semiconductor device according to the present embodiment. FIG. 30 is a band diagram illustrating an energy distribution in a write state of the semiconductor device according to the present embodiment.

Unlike the first and second study examples described above, in the semiconductor device according to the present embodiment, the charge storage film EC1 of the charge storage portion ECP has a two layer structure of the charge storage film EC11 and the charge storage film EC12 (EC12a) formed on the charge storage film EC11. The charge storage film EC12a is formed as an insulating film with a lower film density than the charge storage film EC11 or with a higher oxygen concentration than the charge storage film EC11.

Therefore, by making the film density of the charge storage film EC11 that is the closest to the semiconductor substrate SB high, it is possible to reduce the electron trap positions that are shallow in tams of energy in the charge storage film EC11. As a result, it is possible to prevent a situation where electrons trapped at the electron trap positions that are shallow in tams of energy pass through the insulating film IF1 by direct tunneling to leak to the semiconductor substrate SB, and to improve the data retention characteristics.

Figure 33:
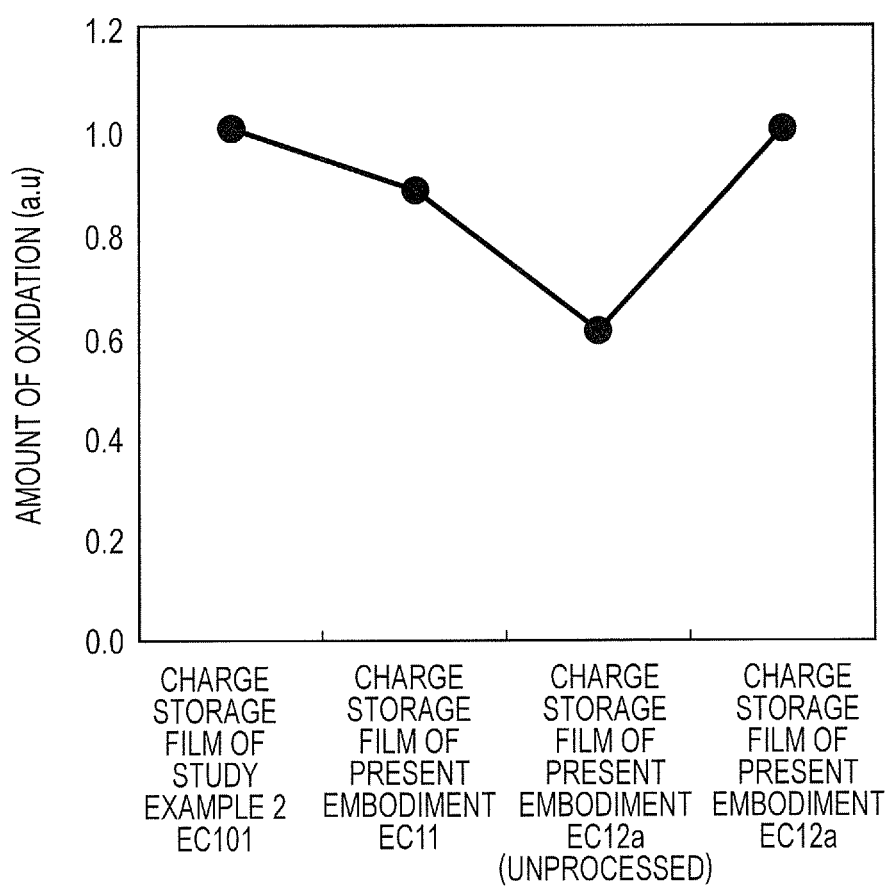
FIG. 33 is a graph illustrating the amount of oxidation of the charge storage film during the manufacturing process of the semiconductor device according to the present embodiment.

In particular, the charge storage film EC11 of the present embodiment is formed by a silicon nitride film with a higher film density (atom density) than the charge storage film EC101 of the second study example, as illustrated in FIG. 33 that will be referred to later. Consequently, the number of the electron trap positions that are shallow in tams of energy, originating from impurities and voids (spaces) in the silicon nitride film including the charge storage film EC11, is reduced as compared with the charge storage film EC101 of the second study example.

Therefore, as compared with the semiconductor device of the second study example, it is possible to prevent a situation where electrons trapped in the charge storage film EC11 that is the closest to the semiconductor substrate SB pass through the insulating film IF1 to leak to the semiconductor substrate SB. As a result, the semiconductor device of the present embodiment can improve the data retention characteristics, as compared with the semiconductor device of the second study example.

Even in a case where electrons are trapped at the electron trap positions that are shallow in tams of energy present in the charge storage film EC12, it is possible to lower the possibility that the electrons pass through the insulating film IF1 by tunneling to leak to the semiconductor substrate SB because the charge storage film EC12 is farther from the semiconductor substrate SB by a distance corresponding to the thickness of the charge storage film EC11. Therefore, the data retention characteristics can be improved as compared with the second study example.

Meanwhile, the charge storage film EC12a (EC12) of the present embodiment has a lower film density than the charge storage film EC11, and is therefore formed as a silicon nitride film that includes many voids (spaces) and can be easily oxidized, as illustrated in FIG. 28. Therefore, the insulating film IFE can be sufficiently formed by oxidizing a portion (surface layer portion) of the charge storage film EC12a. As a result, it is possible to ensure the sufficient number of the electron trap positions ET2 formed around the interface between the insulating film IFE and the charge storage film EC2, so that the data retention characteristics can be improved.

As described above, in the present embodiment, energetically shallow electron trap positions in the charge storage film EC11 are reduced by making the film density of the charge storage film EC11 high, and the insulating film IFE can be formed sufficiently by lowering the film density of the charge storage film EC12a (EC12). Therefore, the data retention characteristics can be improved.

Note that in the present embodiment, the thickness THE11 of the charge storage film EC11 is set to 1.0 nm and the thickness THE12a of the charge storage film EC12a before being oxidized is set to 1.0 nm in order to ensure the thickness THE1 of the charge storage film EC1 and to form the insulating film IFE sufficiently, as illustrated in FIGS. 10 and 12. Consequently, it is preferable that as a result of oxidation of a portion (surface layer portion) of the charge storage film EC12a, the insulating film IFE with a thickness THIE of 0.5 nm is formed and the thickness THE12 of the remaining charge storage film EC12 becomes 0.5 nm.

(Change Rate of Threshold Voltage)

Next, a change rate of a threshold voltage of the semiconductor device of the present embodiment is described, while being compared with that of the semiconductor device of the second study example.

Figure 31:
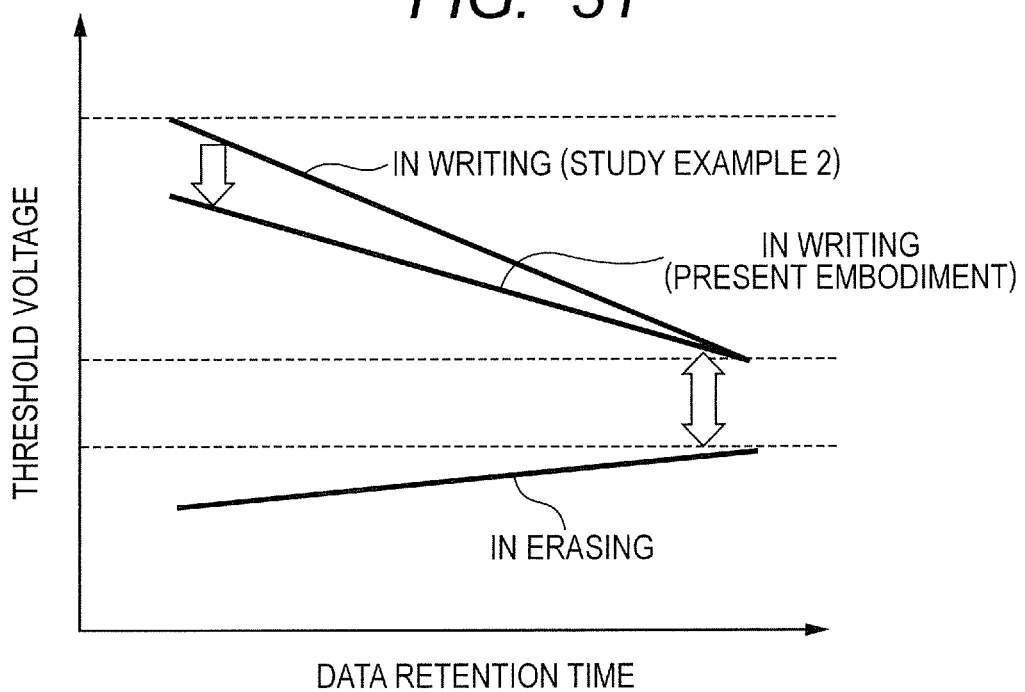
FIG. 31 is a graph illustrating a change of a threshold voltage with a data retention time in each of the semiconductor devices of the present embodiment and the second study example.

FIG. 31 is a graph for explaining a change rate of a threshold voltage of each of the semiconductor devices of the present embodiment and the second study example. The horizontal axis of FIG. 31 represents a data retention time and the vertical axis represents a threshold voltage of a memory cell in writing and erasing.

In the semiconductor device of the second study example, energetically shallow electron trap positions ET101s are present as described before. Therefore, electrons can easily leak from the charge storage film EC101 to the semiconductor substrate SB by tunneling in a write state, that is, while data is retained after injection of the electrons. Thus, a ratio of a change of a threshold voltage with a data retention time, that is, a change rate becomes large.

As a result, in the semiconductor device of the second study example, it is necessary to set a write voltage to be high and inject sufficient electrons into the charge storage film EC101 and charge storage film EC2 in order to ensure a difference of the threshold voltage of the memory cell between in writing and in erasing, also after a predetermined data retention time has elapsed, as illustrated in FIG. 31.

Meanwhile, in the semiconductor device according to the present embodiment, the charge storage film EC11 is formed by a silicon nitride film with a higher film density (atom density) than the charge storage film EC101 of the second study example. Consequently, the number of the electron trap positions that are shallow in terms of energy, originating from impurities and voids (spaces) in the silicon nitride film including the charge storage film EC11, is reduced as compared with the charge storage film EC101 of the second study example.

Therefore, a probability of tunneling in which the electrons trapped in the charge storage film EC11 that is the closest to the semiconductor substrate SB pass through the insulating film IF1 to leak into the semiconductor substrate SB becomes small, so that the change ratio of the threshold voltage can be reduced.

As a result, it is possible to lower a write voltage in the semiconductor device of the present embodiment as compared with that of the second study example, as illustrated in FIG. 31.

(Film Quality Control by Film Forming Temperature)

The manufacturing processes of the charge storage films EC11 and EC12a according to the present embodiment are described in detail below.

Figure 32:
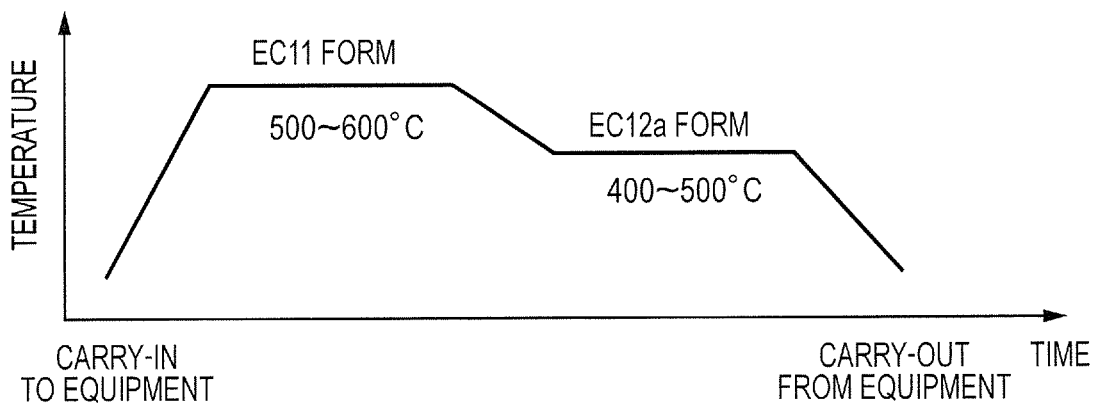
FIG. 32 is a graph illustrating a temporal change of a film forming temperature of a charge storage film during the manufacturing process of the semiconductor device according to the present embodiment.

FIG. 32 is a graph illustrating a temporal change of film forming temperatures of the charge storage films EC11 and EC12a by ALD method.

As described before, in the present embodiment, the charge storage film EC1 is formed by two layers of the charge storage film EC11 and the charge storage film EC12 (EC12a), and the charge storage film EC11 that is the closest to the semiconductor substrate SB is formed as an insulating film with a higher film density than the charge storage film EC12a. That is, the charge storage film EC12a, a portion (surface layer portion) of which is to be oxidized to form the insulating film IFE, is formed as an insulating film with a lower film density than the charge storage film EC11.

In ALD method, in general, it is possible to change a film density of a film to be formed by changing a film forming temperature or a flow rate of a reaction gas. Therefore, in the present embodiment, the film forming temperature of the charge storage film EC11 and the film forming temperature of the charge storage film EC12a are changed. When the film forming temperature is set to be high, reactivity between dichlorosilane gas absorbed onto the semiconductor substrate SB and ammonia gas is improved, so that a high density film can be formed.

Specifically, the charge storage film EC11 is formed at a higher temperature than that in Step S23 where the charge storage film EC12a is formed, as illustrated in FIG. 32 (Step S22 in FIG. 5). Thereafter, the charge storage film EC12a is formed at a lower temperature than that in Step S22 where the charge storage film EC11 is formed (Step S23 in FIG. 5). In the manner described above, it is possible to form the charge storage film EC11 as an insulating film with a higher film density than the charge storage film EC12a.

As for the film forming temperature, it is preferable that the film forming temperature in Step S23 for forming the charge storage film EC12a is 500° C. or lower and the film forming temperature in Step S22 for forming the charge storage film EC11 is higher than that in Step S23 for forming the charge storage film EC12a by 25° C. or more, in order to achieve a difference of a film density between the charge storage film EC12a and the charge storage film EC11. Further, in order to form the insulating film IFE sufficiently, it is preferable that the film forming temperature in Step S22 for forming the charge storage film EC11 is 500° C. to 600° C. and the film forming temperature in Step S23 for forming the charge storage film EC12a is 400° C. to 500° C.

In addition, Steps S22 and S23 are performed in the same ALD method equipment in the present embodiment. Specifically, as illustrated in FIG. 32, the semiconductor substrate SB is carried into the ALD equipment, and the charge storage film EC11 included by a silicon nitride film is formed by ALD method under a condition where the temperature of the semiconductor substrate SB is 500° C. to 600° C. (Step S22 in FIG. 5).

Thereafter, the temperature of the semiconductor substrate SB is lowered, and the charge storage film EC12a included by a silicon nitride film is formed by ALD method under a condition where the temperature of the semiconductor substrate SB is 400° C. to 500° C. (Step S23 in FIG. 5). Finally, the temperature of the semiconductor substrate SB is lowered, and the semiconductor substrate SB is carried out from the ALD equipment.

As described above, by continuously forming the charge storage film EC11 and the charge storage film EC12a in the same ALD equipment, it is possible to improve throughput of the semiconductor device and reduce the manufacturing cost of the semiconductor device.

(Relationship Between Film Density and Amount of Oxidation)

A relationship between a change of a film density with a film forming temperature and the amount of oxidation in ALD method was confirmed. Specifically, XPS (X-ray Photoelectron Spectroscopy) spectra were measured, and the amount of oxidation of a surface was compared from the peak intensity of $SiO_2$.

FIG. 33 illustrates a relative value of the amount of oxidation of a surface of each of the charge storage film EC101 of the second study example subjected to liquid processing, the charge storage film EC11 of the present embodiment subjected to liquid processing, the charge storage film EC12a (unprocessed) of the present embodiment before liquid processing, and the charge storage film EC12a of the present embodiment subjected to liquid processing, from the left. The relative value of the amount of oxidation means a value obtained by comparison with the peak intensity of $SiO_2$ in the XPS spectra of the charge storage film EC101 of the second study example subjected to liquid processing, which is assumed to be 1.

As illustrated in FIG. 33, the amount of oxidation of the charge storage film EC11 subjected to liquid processing (the second from the left in FIG. 33) is smaller than the amount of oxidation of the charge storage film EC12a subjected to liquid processing (right end in FIG. 33). As the film density of a silicon nitride film including the charge storage film EC12a is higher, voids (spaces) and impurities therein are less, so that it is more difficult for the silicon nitride film to be oxidized. Therefore, the result in FIG. 33 reflects that the charge storage film EC11 was formed with a higher film density than the charge storage film EC12a because the charge storage film EC11 was formed at a higher film forming temperature than the charge storage film EC12a.

Meanwhile, it is found from the above result that even if the top surface of the charge storage film EC11 is subjected to liquid processing, the insulating film IFE cannot be formed sufficiently because it is difficult for the charge storage film EC11 to be oxidized.

In addition, as illustrated in FIG. 33, the amount of oxidation of the charge storage film EC12a subjected to liquid processing (right end in FIG. 33) is approximately the same as the amount of oxidation of the charge storage film EC101 of the second study example, subjected to liquid processing. Therefore, it is found that the film density of the charge storage film EC12a is equal to the charge storage film EC101 of the second study example and the insulating film IFE can be sufficiently formed by liquid processing for the top surface of the charge storage film EC12a.

Further, a value of the charge storage film EC12a not subjected to liquid processing is shown as a reference as the second from the right in FIG. 33. It is considered that the value shows that the surface of the charge storage film EC12a is oxidized to some extent because it is exposed to the air during XPS measurement.

<Descriptions of Modifications>
(First Modification)

Figure 34:
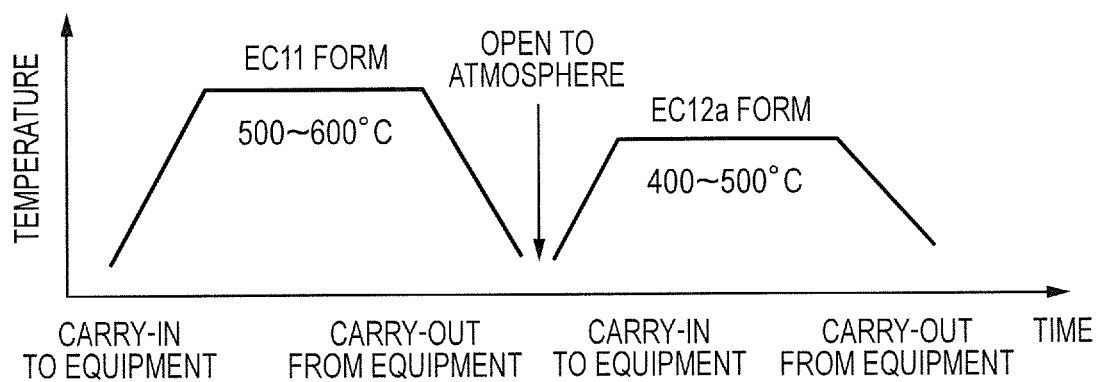
FIG. 34 is a graph illustrating a temporal change of a film forming temperature of a charge storage film during a manufacturing process of a semiconductor device according to a first modification.

A first modification is a modification to the film forming conditions of the charge storage film EC11 and the charge storage film EC12a in the above embodiment. FIG. 34 is a graph illustrating a temporal change of film forming temperatures of the charge storage films EC11 and EC12a by ALD method in a manufacturing method of a semiconductor device of the first modification.

In the above embodiment, formation of the charge storage film EC11 (Step S22) and formation of the charge storage film EC12a (Step S23) are continuously performed in the same ALD equipment. Meanwhile, in the first modification, after the charge storage film EC11 is formed on the semiconductor substrate SB in Step S22, the semiconductor substrate SB is carried out from the ALD equipment once, as illustrated in FIG. 34. Thereafter, the semiconductor substrate SB is carried into the same ALD equipment or another ALD equipment and Step S23 is performed to form the charge storage film EC12a.

In this case, it is also possible to minimize surface contamination of the charge storage film EC11 by keeping the semiconductor substrate SB carried out after Step S22, preferably in an inert gas, such as nitrogen gas, and then carrying the semiconductor substrate SB into the equipment for performing Step S23.

However, it is preferable to continuously form the charge storage film EC11 and the charge storage film EC12a without breaking a vacuum as in the present embodiment, from a viewpoint of preventing surface contamination of the charge storage film EC11 and removing impurities and gas from the interface between the charge storage films EC11 and EC12a.

(Second Modification)

A second modification is a modification to the film forming conditions of the charge storage film EC11 and the charge storage film EC12a in the above embodiment and the first modification. Here, the second modification is described as a modification to the above embodiment.

Figure 35:
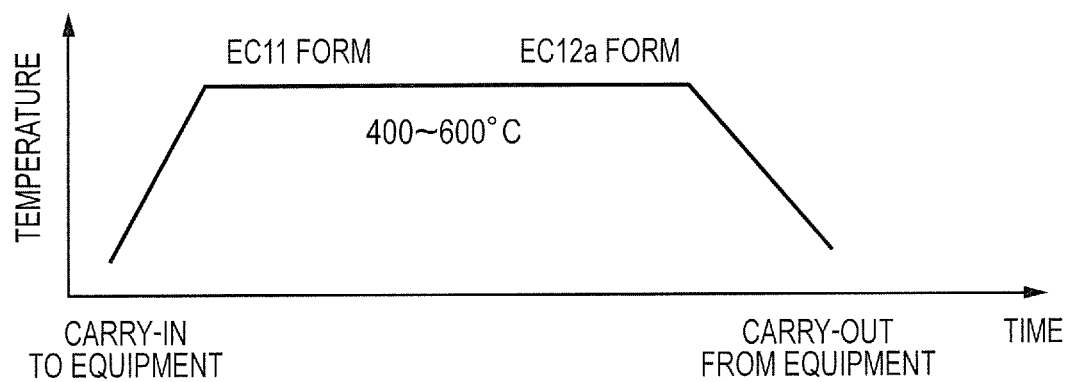
FIG. 35 is a graph illustrating a temporal change of a film forming temperature of a charge storage film during a manufacturing process of a semiconductor device according to a second modification.
Figure 36:
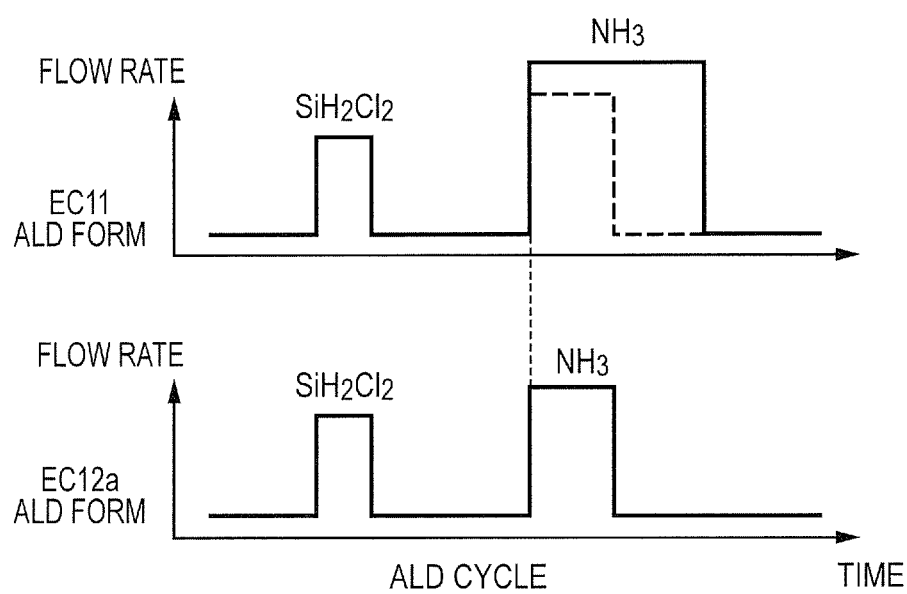
FIG. 36 is a graph illustrating a temporal change of a flow rate when the charge storage film is formed by ALD method, during the manufacturing process of the semiconductor device of the second modification.

FIG. 35 is a graph illustrating a temporal change of film forming temperatures of the charge storage films EC11 and EC12a by ALD method in a manufacturing method of a semiconductor device of the second modification. FIG. 36 is a graph illustrating a temporal change of flow rates of dichlorosilane ($SiH_2Cl_2$) gas and ammonia ($NH_3$) gas in formation of the charge storage films EC11 and EC12a by ALD method in the manufacturing method of the semiconductor device of the second modification.

The charge storage film EC12a is formed as an insulating film with a lower film density (atom density) than the charge storage film EC11, as in the above embodiment. In the second modification, instead of setting the film forming temperature to be constant in Step S22 for forming the charge storage film EC11 and Step S23 for forming the charge storage film EC12a in FIG. 5, a flow rate of a reaction gas is changed.

Specifically, an arbitrary temperature from 400° C. to 600° C. is selected in formation of the charge storage film EC11 and formation of the charge storage film EC12a by ALD method, and the film forming temperature is kept constant at the selected temperature, as illustrated in FIG. 35.

In addition, in film formation by ALD method, a flow rate and a supply time of dichlorosilane ($SiH_2Cl_2$) gas are the same for both the charge storage films EC11 and EC12a, while a flow rate of ammonia ($NH_3$) gas for the charge storage film EC11 is larger and a supply time of ammonia gas for the charge storage film EC11 is longer as compared with those for the charge storage film EC12a, as illustrated in FIG. 36.

As a result, ammonia gas can easily collide with dichlorosilane gas in reaction between dichlorosilane gas absorbed onto the semiconductor substrate SB and ammonia gas, and unreacted dichlorosilane is reduced. Therefore, the film density of the charge storage film EC11 as a silicon nitride film becomes higher.

Accordingly, the film density can be controlled by controlling the flow rate of the reaction gas, so that the charge storage film EC11 with a higher film density than the charge storage film EC12a can be formed.

The film density of a film to be formed is more largely affected by a temperature change than by a flow rate change. Therefore, it is possible to change the film density with better controllability in the above embodiment than in the second modification.

(Third Modification)

A third modification is a modification to the film forming conditions of the charge storage film EC11 and the charge storage film EC12a in the above embodiment, the first modification, and the second modification. Here, the third modification is described as a modification to the above embodiment.

Figure 37:
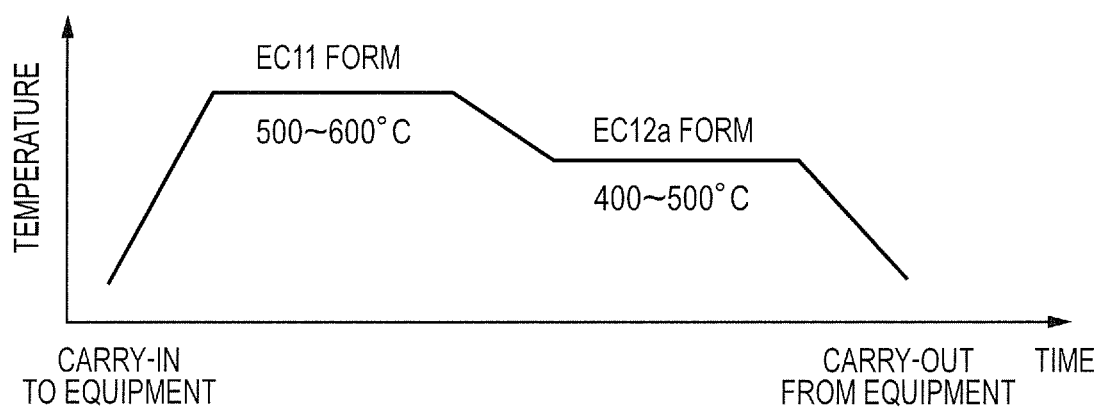
FIG. 37 is a graph illustrating a temporal change of a film forming temperature of a charge storage film during a manufacturing process of a semiconductor device of a third modification.
Figure 38:
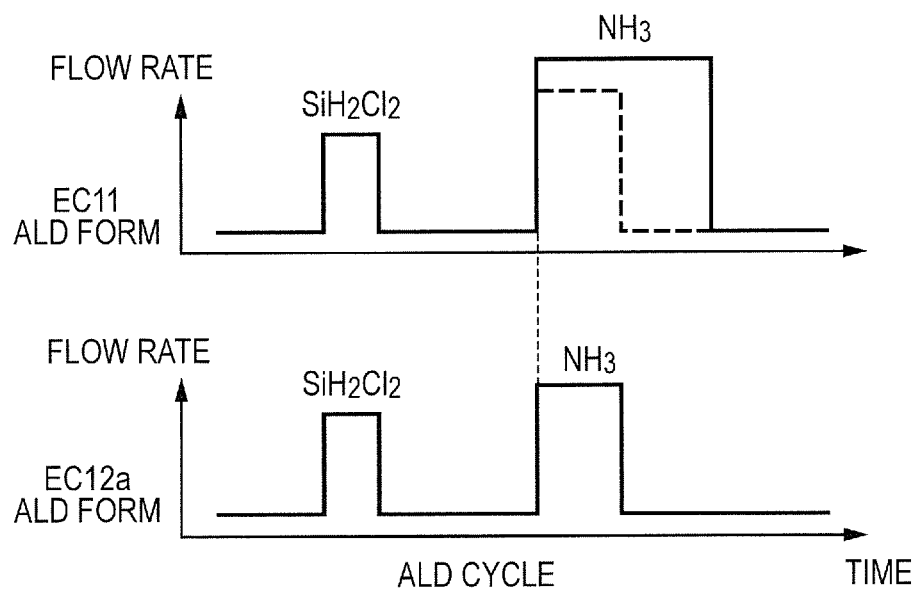
FIG. 38 is a graph illustrating a temporal change of a flow rate when the charge storage film is formed by ALD method, during the manufacturing process of the semiconductor device according to the third modification.

FIG. 37 is a graph illustrating a temporal change of film forming temperatures of the charge storage films EC11 and EC12a by ALD method in a manufacturing method of a semiconductor device of the third modification. FIG. 38 is a graph illustrating a temporal change of flow rates of dichlorosilane ($SiH_2Cl_2$) gas and ammonia ($NH_3$) gas in formation of the charge storage films EC11 and EC12a by ALD method in the manufacturing method of the semiconductor device of the third modification.

As described before, the film forming temperature is changed in the above embodiment, and the flow rate of the reaction gas is changed in the second modification. Further, both the film forming temperature and the flow rate of the reaction gas can be changed. Therefore, in Step S22 for forming the charge storage film EC11 and Step S23 for forming the charge storage film EC12a, both the film forming temperature and the flow rate of the reaction gas are changed.

Specifically, as illustrated in FIG. 37, the semiconductor substrate SB is carried into the ALD equipment, and the charge storage film EC11 included by a silicon nitride film is formed by ALD method under a condition where the temperature of the semiconductor substrate SB is 500° C. to 600° C. (Step S22 in FIG. 5).

Thereafter, the temperature of the semiconductor substrate SB is lowered, and the charge storage film EC12a included by a silicon nitride film is formed by ALD method at a temperature from 400° C. to 500° C. (Step S23 in FIG. 5). Finally, the temperature of the semiconductor substrate SB is lowered, and the semiconductor substrate SB is carried out from the ALD equipment.

In this case, a flow rate and a supply time of dichlorosilane ($SiH_2Cl_2$) gas are the same for both the charge storage films EC11 and EC12a, while a flow rate of ammonia ($NH_3$) gas for the charge storage film EC11 is larger and a supply time of ammonia gas for the charge storage film EC11 is longer as compared with those for the charge storage film EC12a, as illustrated in FIG. 38.

As a result, in film formation of the charge storage film EC11, ammonia gas can easily collide with dichlorosilane gas in reaction between dichlorosilane gas absorbed onto the semiconductor substrate SB and ammonia gas, and reaction is accelerated because of a high temperature. Therefore, unreacted dichlorosilane is reduced, and the film density of a silicon nitride film becomes higher.

As described above, it is possible to change the film density of a film to be formed with better controllability by changing both the film forming temperature and the flow rate of the reaction gas. Therefore, according to the third modification, it is possible to form the charge storage film EC11 with a higher film density than the charge storage film EC12a, with better controllability more effectively as compared with the above embodiment and the second modification.

(Fourth Modification)

A fourth modification is a modification to the configuration of the charge storage portion ECP in the above embodiment.

Figure 39:
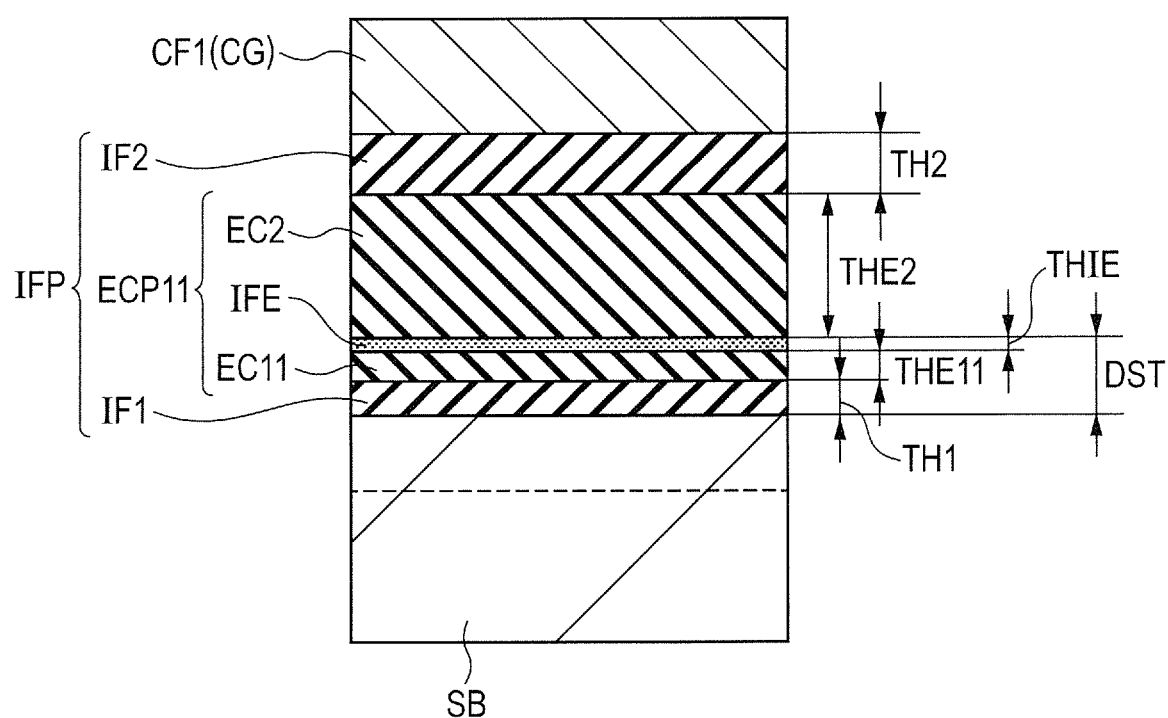
FIG. 39 is a cross-sectional view of a main portion of a semiconductor device according to a fourth modification.
Figure 40:
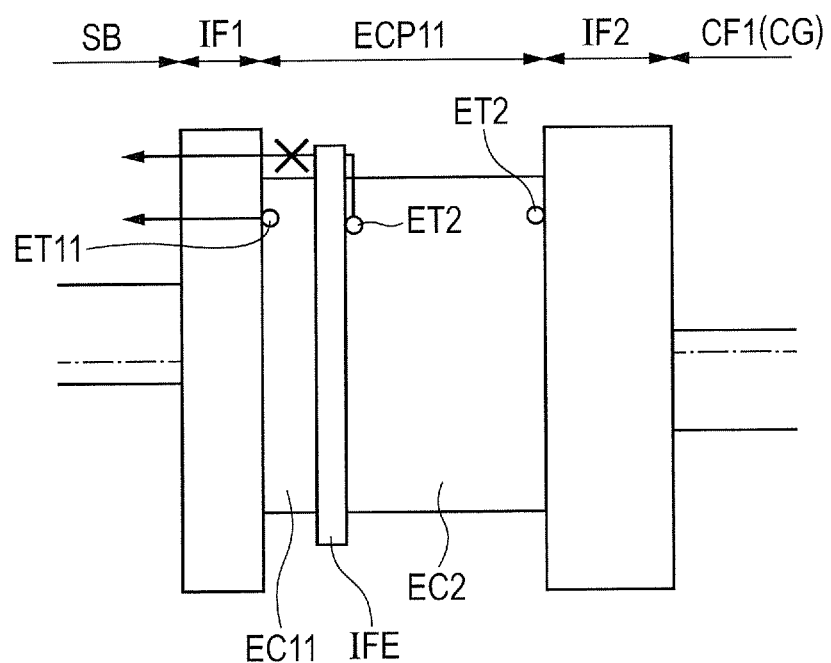
FIG. 40 is a band diagram illustrating an energy distribution in a write state of the semiconductor device according to the fourth modification.

FIG. 39 is an enlarged cross-sectional view that enlarges and illustrates the gate insulating film GIM and its surroundings in a cross-sectional view of a main portion of a semiconductor device of a fourth modification. FIG. 40 is a band diagram illustrating an energy distribution in a write state of the semiconductor device of the fourth modification.

Figure 41:
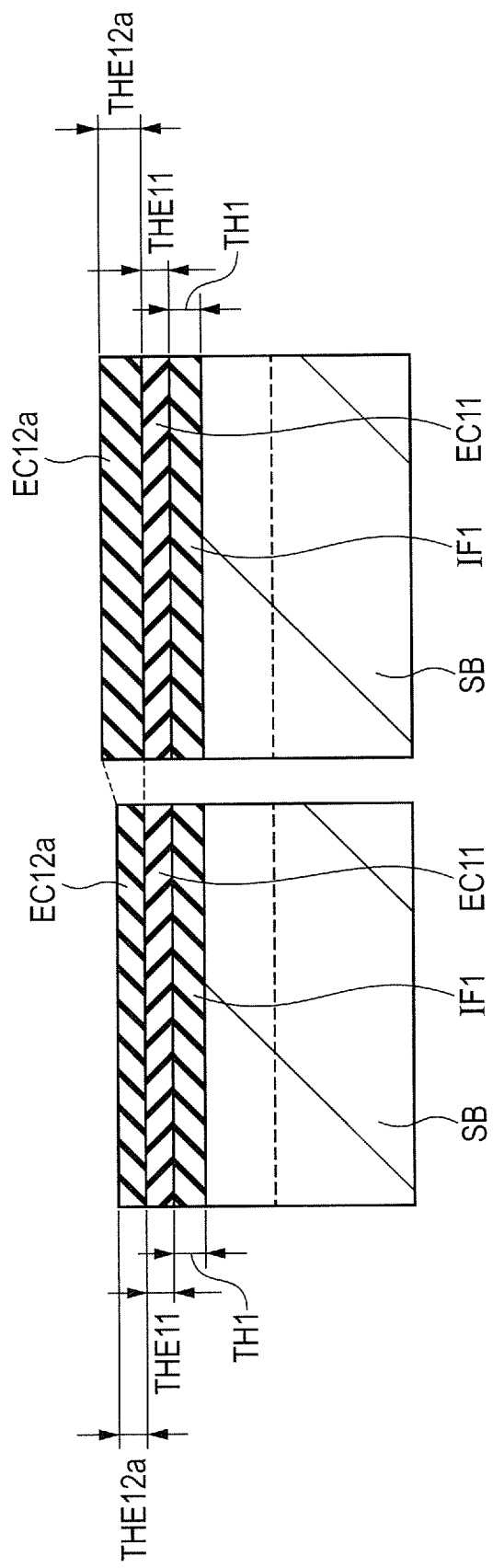
FIG. 41 is a cross-sectional view of a main portion, illustrating a thickness change of a charge storage film during a manufacturing process of the semiconductor device according to the fourth modification.
Figure 42:
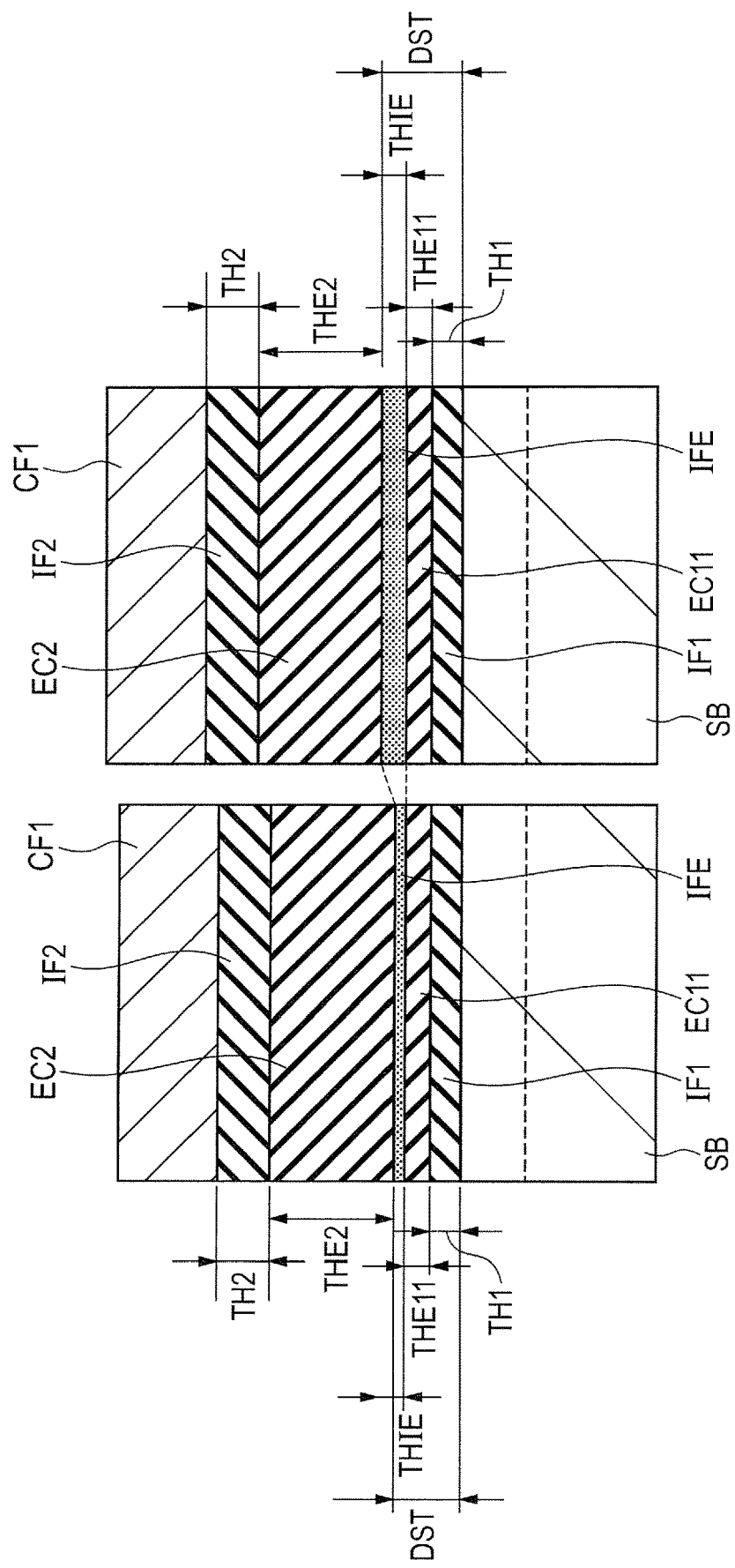
FIG. 42 is a cross-sectional view of a main portion, illustrating a thickness change of an insulating film during the manufacturing process of the semiconductor device according to the fourth modification.

FIG. 41 is a cross-sectional view of the semiconductor device of the fourth modification during a manufacturing process. FIG. 42 is an enlarged cross-sectional view that enlarges and illustrates the gate insulating film GIM and its surroundings in the cross-sectional view of the main portion of the semiconductor device of the fourth modification.

As described before, in the above embodiment illustrated in FIG. 16, the charge storage portion ECP is formed by the charge storage film EC1 included by the charge storage film EC11 and the charge storage film EC12, the insulating film IFE, and the charge storage film EC2. Meanwhile, in the semiconductor device of the fourth modification, a charge storage portion ECP11 is included by the charge storage film EC11, the insulating film IFE, and the charge storage film EC2, but does not have the charge storage film EC12, as illustrated in FIG. 39. That is, only the charge storage film EC11 included by a silicon nitride film with a higher film density than the charge storage film EC12a is present as a charge storage film located between the insulating films IF1 and IFE.

A manufacturing method of the semiconductor device of the fourth modification is described here. In the above embodiment, a portion (surface layer portion) of the charge storage film EC12a is oxidized to form the insulating film IFE in Step S24 in FIG. 5. Meanwhile, the fourth modification is different from the above embodiment in that the charge storage film EC12a is entirely oxidized to form the insulating film IFE.

Specifically, liquid processing, that is, wet processing is performed for the top surface of the charge storage film EC12a formed of silicon nitride, thereby entirely oxidizing the charge storage film EC12a to form the insulating film IFE having the thickness THIE. In this step, the charge storage film EC12a that is not oxidized does not remain below the insulating film IFE. Only the charge storage film EC11 remains.

The thickness THIE of the insulating film IFE formed by this liquid processing is a magnitude corresponding to at least one atomic layer, and is about 0.1 to 0.5 nm. Therefore, by setting the thickness THE12a of the charge storage film EC12a before oxidation to 0.1 to 0.5 nm, the charge storage film EC12a is entirely oxidized by oxidation.

That is, while the charge storage film EC12a is present before oxidation, only the charge storage film EC11 formed by a silicon nitride film with a higher film density than the charge storage film EC12a is present as the charge storage film located between the insulating films IF1 and IFE after oxidation.

From the above, in the fourth modification, the insulating film IFE is formed by oxidizing the charge storage film EC12a with a lower film density than the charge storage film EC11. Therefore, the insulating film IFE can be obtained as a sufficiently oxidized insulating film. Accordingly, as in the above embodiment, it is possible to ensure the sufficient number of the electron trap positions ET2 formed around the interface between the insulating film IFE and the charge storage film EC2, so that the data retention characteristics can be improved.

Further, as in the above embodiment, the film density of the charge storage film EC11 is made high, thereby reducing the electron trap positions that are shallow in terms of energy in the charge storage film EC11. Thus, it is possible to prevent a situation where electrons trapped in the charge storage film EC11 that is the closest to the semiconductor substrate SB pass through the insulating film IF1 to leak to the semiconductor substrate SB.

In the above embodiment, because the charge storage film EC12 with a lower film density than the charge storage film EC11 is present, it is likely that electrons are trapped at the electron trap positions that are shallow in terms of energy, present in the charge storage film EC12, and leak to the semiconductor substrate SB. Meanwhile, there is no charge storage film EC12 with a lower film density than the charge storage film EC11 in the semiconductor device of the fourth modification. Therefore, the above possibility can be removed. Thus, the fourth modification can further improve the data retention characteristics, as compared with the above embodiment.

Further, the insulating film IFE is formed by entirely oxidizing the charge storage film EC12a in the manufacturing method of the semiconductor device according to the fourth modification. Therefore, it is possible to form the insulating film IFE in accordance with the thickness THE12a of the charge storage film EC12a. Specifically, as illustrated in FIG. 41, the thickness of the charge storage film EC12a to be formed is changed (from the left to the right in FIG. 41, Step S23 in FIG. 5). Thus, the insulating film IFE with the same thickness as the thickness of the charge storage film EC12a can be formed (Step S24 in FIG. 5). As a result, the thickness THIE of the insulating film IFE can be controlled, as illustrated in FIG. 42 (from the left to the right in FIG. 42).

Furthermore, the underlying charge storage film EC11 has a higher film density and is hard to oxidize. Therefore, only the upper charge storage film EC12a can be selectively oxidized by liquid processing. Accordingly, it is possible to form the charge storage film EC11 and the insulating film IFE with good controllability of film thickness.

As described above, the manufacturing method of the semiconductor device of the fourth modification allows the film thickness to be easily set in accordance with required characteristics. Consequently, the fourth modification can easily improve the data retention characteristics, as compared with the above embodiment.

(Fifth Modification)

In the manufacturing method of the semiconductor device according to the above embodiment, the semiconductor substrate SB is subjected to liquid processing that uses pure water as processing liquid, thereby oxidizing the top surface of the charge storage film EC12a to form the insulating film IFE. Alternatively, liquid processing can be performed for the semiconductor substrate SB, which uses processing liquid containing ozone water or hydrogen peroxide solution, thereby forming the insulating film IFE, as a fifth modification. The configuration of the semiconductor device of the fifth modification is the same as that of the semiconductor device according to the above embodiment.

However, ozone water and hydrogen peroxide solution are large in oxidizing power. Therefore, it is preferable to perform liquid processing that uses pure water as in the present embodiment, in order to form the thin insulating film IFE with good controllability.

What is claimed is:
1. A manufacturing method of a semiconductor device, comprising the steps of:
   (a) forming an insulating film portion over a principal surface of a semiconductor substrate;
   (b) forming a conductive film over the insulating film portion; and
   (c) patterning the conductive film and the insulating film portion to form 1) a gate electrode included by the conductive film and 2) a gate insulating film included by the insulating film portion between the gate electrode and the semiconductor substrate, wherein the step (a) includes the steps of
(a1) forming a first insulating film containing silicon and oxygen over the principal surface of the semiconductor substrate,
(a2) forming a second insulating film containing silicon and nitrogen over the first insulating film (a3) forming a third insulating film containing silicon and oxygen over the second insulating film,
(a4) forming a fourth insulating film containing silicon and nitrogen over the third insulating film, and
(a5) forming a fifth insulating film containing silicon and oxygen over the fourth insulating film,
wherein the fourth insulating film is thicker than the second insulating film, and
wherein the third insulating film is thinner than the second insulating film.

2. The manufacturing method according to claim 1, wherein in the step (a2), the second insulating film is formed by atomic layer deposition.

3. The manufacturing method according to claim 1, wherein in the step (a4), the fourth insulating film is formed by low pressure chemical vapor deposition.

4. The manufacturing method according to claim 1,
wherein the first insulating film is formed of silicon oxide,
wherein the second insulating film is formed of silicon nitride,
wherein the third insulating film is formed of silicon oxide,
wherein the fourth insulating film is formed of silicon nitride, and
wherein the fifth insulating film is formed of silicon oxide.

5. The manufacturing method according to claim 1,
wherein the second insulating film is a first charge storage portion capable of storing charges therein, and
wherein the fourth insulating film is a second charge storage portion capable of storing charges therein.

6. The manufacturing method according to claim 1,
wherein a non-volatile memory is formed by the conductive film and the gate insulating film, and
wherein in the non-volatile memory, data is written by injection of electrons from the semiconductor substrate to the gate insulating film and data is erased by injection of holes from the semiconductor substrate to the gate insulating film.

7. The manufacturing method according to claim 1, wherein the step (a2) comprises:
(a21) forming an underlying insulating film on the first insulating film; and
(a22) forming an upper insulating film on the underlying insulating film,
wherein the upper insulating film of the second insulating film in the step (a22) is thinner than the underlying insulating film of the second insulating film in the step (a21), and
wherein the step (a3) comprises oxidizing a portion of the upper insulating film to form the third insulating film containing silicon and oxygen over a remaining portion of the upper insulating film.

8. The manufacturing method according to claim 7, wherein in the step (a2), the upper insulating film is formed at a lower flow rate of ammonia gas than the underlying insulating film.

9. The manufacturing method according to claim 7,
wherein a forming temperature of the upper insulating film in the step (a22) is lower than a forming temperature of the underlying insulating film in the step (a21),
wherein the forming temperature of the upper insulating film is at a temperature within a range of 400° C. to 500° C., and
wherein the forming temperature of the underlying insulating film is at a temperature 1) within a range of 500° C. to 600° C. and 2) higher than the forming temperature of the upper insulating film by 25° C. or more.

10. The manufacturing method according to claim 7, wherein in the step (a3), oxidizing the portion of the upper insulating film comprises processing a top surface of the upper insulating film using a processing liquid containing water to form the third insulating film.

11. The manufacturing method according to claim 10, wherein the processing liquid contains ozone water.

12. The manufacturing method according to claim 10, wherein the processing liquid contains hydrogen peroxide solution.

13. A manufacturing method of a semiconductor device, comprising the steps of:
(a) forming an insulating film portion over a principal surface of a semiconductor substrate;
(b) forming a conductive film over the insulating film portion; and
(c) patterning the conductive film and the insulating film portion to form a gate electrode included by the conductive film and a gate insulating film included by the insulating film portion between the gate electrode and the semiconductor substrate,
wherein the step (a) includes the steps of
(a1) forming a first insulating film containing silicon and oxygen over the principal surface of the semiconductor substrate, and
(a2) forming a second insulating film containing silicon and nitrogen over the first insulating film by forming an underlying film on the first insulating film and an upper insulating film on the underlying insulating film, wherein the step comprises:
(a21) forming an underlying insulating film on the first insulating film; and
(a22) forming an upper insulating film on the underlying insulating film, wherein the upper insulating film of the second insulating film is thinner than the underlying insulating film of the second insulating film,
(a3) forming a third insulating film containing silicon and oxygen over the second insulating film,
(a4) forming a fourth insulating film containing silicon and nitrogen over the third insulating film, and
(a5) forming a fifth insulating film containing silicon and oxygen over the fourth insulating film,
wherein the fourth insulating film is thicker than the second insulating film,
wherein the step (a3) comprises oxidizing a portion of the upper insulating film to form the third insulating film containing silicon and oxygen over a remaining portion of the upper insulating film,
wherein the oxidizing comprises processing a top surface of the upper insulating film using a processing liquid containing pure water to form the third insulating film,
wherein a forming temperature of the upper insulating film is lower than a forming temperature of the underlying insulating film, wherein the forming temperature of the upper insulating film is a at temperature within a range of 400° C. to 500° C. and wherein the forming temperature of the underlying insulating film is at a temperature 1) within a range of 500° C. to 600° C. and 2) higher than the forming temperature of the upper insulating film by 25° C. or more.

* * * * *